(12) United States Patent
Tien et al.

(10) Patent No.: US 11,830,834 B2
(45) Date of Patent: Nov. 28, 2023

(54) SEMICONDUCTOR DEVICE, SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Hsing Kuo Tien, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 187 days.

(21) Appl. No.: 17/372,339

(22) Filed: Jul. 9, 2021

(65) Prior Publication Data
US 2023/0009219 A1   Jan. 12, 2023

(51) Int. Cl.
  *H01L 23/48* (2006.01)
  *H01L 23/52* (2006.01)
  (Continued)

(52) U.S. Cl.
  CPC ............ *H01L 24/05* (2013.01); *H01L 23/481* (2013.01); *H01L 23/49816* (2013.01);
  (Continued)

(58) Field of Classification Search
  CPC . H01L 24/05; H01L 23/481; H01L 23/49816; H01L 23/49822; H01L 23/49838; H01L 24/24; H01L 25/162; H01L 2224/05565; H01L 2224/05573; H01L 2224/24225; H01L 2924/15311; H01L 2224/16225; H01L 24/16; H01L 2224/0401; H01L 2224/73204; H01L 2224/16145; H01L 2224/16227; H01L 24/81; H01L 24/13; H01L 25/0657; H01L 2225/06513; H01L 2224/12105; H01L 2224/04105; H01L 2225/06517; H01L 2224/73253; H01L 2225/1058; H01L 24/17; H01L 2924/18161; H01L 21/563; H01L 24/06; H01L 21/56; H01L 24/14; H01L 2224/16; H01L 2224/81; H01L 2224/81801; H01L 2224/04042; H01L 2224/16238; H01L 24/08;
  (Continued)

(56) References Cited

U.S. PATENT DOCUMENTS

| | | | |
|---|---|---|---|
| 9,595,482 B2 * | 3/2017 | Chen | H01L 23/481 |
| 2015/0028486 A1 * | 1/2015 | Liu | H01L 23/5389 |
| | | | 257/773 |
| 2018/0040548 A1 * | 2/2018 | Kim | H01L 21/4857 |

FOREIGN PATENT DOCUMENTS

WO   WO-2018182597 A1 * 10/2018 ............. H01L 21/56

* cited by examiner

*Primary Examiner* — Niki H Nguyen
(74) *Attorney, Agent, or Firm* — FOLEY & LARDNER LLP

(57) ABSTRACT

A semiconductor device, a semiconductor device package, and a method of manufacturing a semiconductor device package are provided. The semiconductor device includes an electronic component and a first protection layer. The electronic component includes a first conductive pad protruded out of a first surface of the electronic component. The first protection layer covers an external surface of the first conductive pad. The first surface of the electronic component is exposed from the first protection layer.

17 Claims, 19 Drawing Sheets

(51) Int. Cl.
*H01L 23/00* (2006.01)
*H01L 23/498* (2006.01)
*H01L 25/16* (2023.01)

(52) U.S. Cl.
CPC .. *H01L 23/49822* (2013.01); *H01L 23/49838* (2013.01); *H01L 24/24* (2013.01); *H01L 25/162* (2013.01); *H01L 2224/05565* (2013.01); *H01L 2224/05573* (2013.01); *H01L 2224/24225* (2013.01)

(58) Field of Classification Search
CPC . H01L 2924/15331; H01L 2224/13025; H01L 2224/1403; H01L 2225/06586; H01L 2224/13022; H01L 2224/81193; H01L 2224/0603; H01L 2224/82; H01L 24/10; H01L 2924/15312; H01L 2224/80001; H01L 2224/023; H01L 2224/85201; H01L 2224/73209; H01L 2224/48228
See application file for complete search history.

SEMICONDUCTOR DEVICE, SEMICONDUCTOR DEVICE PACKAGE AND METHOD OF MANUFACTURING THE SAME

BACKGROUND

1. Technical Field

The present disclosure relates generally to a semiconductor device, a semiconductor device package, and a method of manufacturing a semiconductor device package.

2. Description of the Related Art

Along with the rapid developments in electronics industry and the progress of semiconductor processing technologies, semiconductor chips are integrated with an increasing number of electronic components to achieve improved electrical performance and additional functions. Accordingly, electronic components may be embedded in a substrate to reduce the size of the package allowing a large number of electronic components that can be integrated into the package.

SUMMARY

In one or more embodiments, a semiconductor device includes an electronic component and a first protection layer. The electronic component includes a first conductive pad protruded out of a first surface of the electronic component. The first protection layer covers an external surface of the first conductive pad. The first surface of the electronic component is exposed from the first protection layer.

In one or more embodiments, a semiconductor device package includes a substrate, an electronic component, and a filling material. The substrate defines a cavity. The electronic component is disposed in the cavity. The electronic component includes a conductive pad. The filling material is in the cavity. The filling material and the conductive pad are separated by an element.

In one or more embodiments, a semiconductor device package includes a substrate, an electronic component, a protection layer, and a first circuit layer. The electronic component is embedded in the substrate. The electronic component includes a conductive pad. The protection layer is embedded in the substrate and covers an external surface of the conductive pad. The first circuit layer is on the substrate and spaced apart from the protection layer. The first circuit layer is electrically connected to the electronic component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
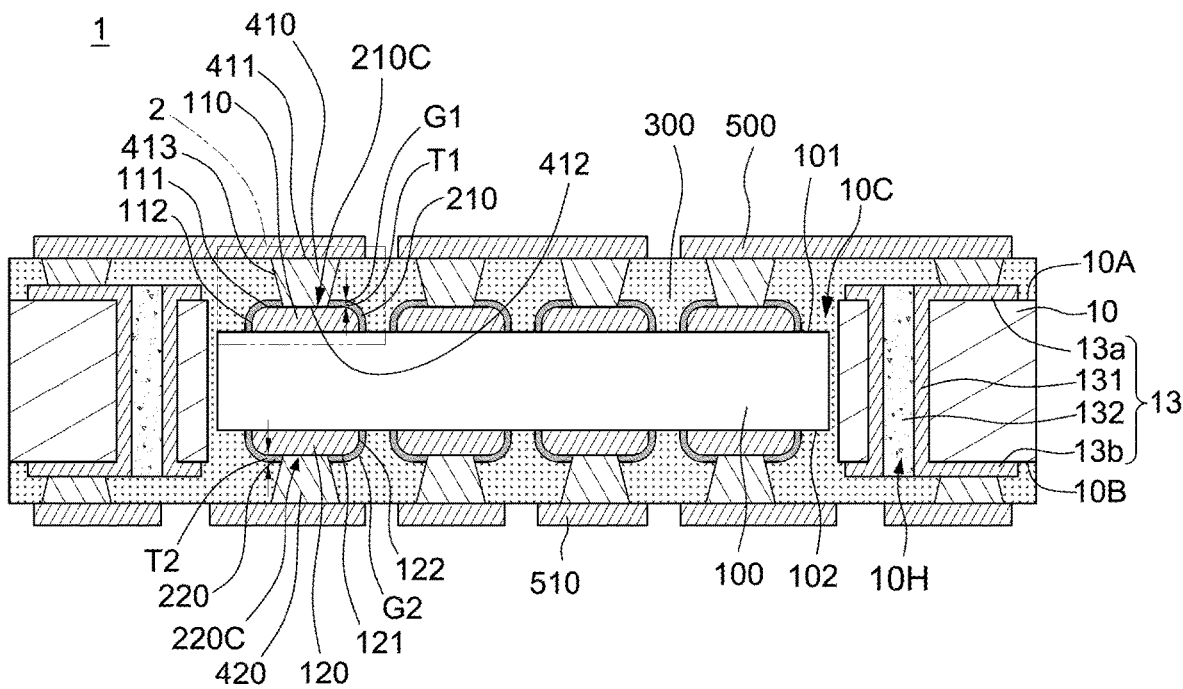
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a substrate 10, an electronic component 100, protection layers 210 and 220, a filling material 300, conductive vias 410 and 420, and circuit layers 500 and 510.

The substrate 10 has an upper surface 10A and a bottom surface 10B opposite to the upper surface 10A. The substrate 10 may be formed of or include a dielectric material or an insulating material. The substrate 10 may include, for example, a printed circuit board, such as a paper-based copper foil laminate, a composite copper foil laminate, or a polymer-impregnated glass-fiber-based copper foil laminate. The substrate 10 may be a core substrate, a coreless substrate, or other suitable substrate. The substrate 10 may define at least one through hole 10H. At least one interconnection via 13 may be disposed in the through hole 10H. The interconnection via 13 may include a base conductive layer 131 and an insulation material 132. In some embodiments, the base conductive layer 131 is disposed or formed on a side wall of the through hole 10H and defines a central through hole within the through hole 10H. In some embodiments, the insulation material 132 is filled the central through hole defined by the base conductive layer 131. In some other embodiments, the insulation material 132 may be omitted, and a bulk conductive material may be filled in the through hole 10H to form the interconnection via. In some embodiments, the interconnection via 13 may further include an upper conductive pad 13a and a bottom conductive pad 13b respectively disposed on the upper surface 10A and the bottom surface 10B of the substrate 10 and electrically connected to the base conductive layer 131.

In some embodiments, the substrate 10 may define at least one cavity 10C. In some embodiments, the cavity 10C may be a through cavity or through hole that penetrates through the substrate 10. In some other embodiments, the cavity 10C may be a recess that recesses from the upper surface 10A without penetrating through the substrate 10.

The electronic component 100 may be embedded in the substrate 10. In some embodiments, the electronic component 100 is disposed in the cavity 10C. The electronic component 100 may be lower than, leveled with, or higher than the upper surface 10A of the substrate 10. The electronic component 100 may include a passive component, such as a capacitor, a resistor, an inductor, or a combination thereof. The semiconductor device package 1 may include one or more electronic components 100 embedded in the substrate 10 or disposed in the cavity 10C, and the number of the electronic components 100 may vary according to actual applications.

The electronic component 100 has a surface 101 (also referred to as "an upper surface") and a surface 102 (also referred to as "a bottom surface") opposite to the surface 101. In some embodiments, the electronic component 100 may include at least one conductive pad 110 (also referred to as "an upper electrode"). In some embodiments, the conductive pad 110 is protruded out of the surface 101 of the electronic component 100. In some embodiments, the electronic component 100 may further include at least one conductive pad 120 (also referred to as "a bottom electrode"). In some embodiments, the conductive pad 120 is protruded out of the surface 102 of the electronic component 100. In some embodiments, the conductive pads 110 and 120 may be or may include gold (Au), silver (Ag), aluminum (Al), copper (Cu), or an alloy thereof.

In some embodiments, the protection layer 210 covers an external surface of the conductive pad 110. The external surface of the conductive pad 110 of the electronic component 100 may include an upper surface 111 and a lateral surface 112 protruded out of the surface 101 of the electronic component 100. In some embodiments, the surface 101 of the electronic component 100 is exposed from the protection layer 210. In some embodiments, the protection layer 210 is conformal with the external surface (e.g., the upper surface 111 and the lateral surface 112) of the conductive pad 110 of the electronic component 100. In some embodiments, the protection layer 210 defines an opening 210C exposing a portion of the conductive pad 110. In some embodiments, the protection layer 210 is embedded in the substrate 10.

In some embodiments, the protection layer 210 has a substantially uniform thickness. In some embodiments, the thickness T1 of the protection layer 210 may be from about 0.1 µm to about 0.3 µm. In some embodiments, an average surface roughness Ra of the external surface (e.g., the upper surface 111 and the lateral surface 112) of the conductive pad 110 may be from about 1.2 µm to about 2.5 µm. In some embodiments, an average surface roughness Ra of the external surface (e.g., the upper surface 111 and the lateral surface 112) of the conductive pad 110 may be from about 1.3 µm to about 1.8 µm. In some embodiments, the protection layer 210 includes an organometallic protection layer. In some embodiments, the protection layer 210 includes an organometallic complex. In some embodiments, the protection layer 210 is formed of one or more organometallic complexes. In some embodiments, the organometallic complex may include a Cu-imidazole complex. In some embodiments, the protection layer 210 includes an organic solderability preservative (OSP) material. In some embodiments, the conductive pad 110 and the organometallic complex of the protection layer 210 include a same metal. For example, the conductive pad 110 and the organometallic complex of the protection layer 210 both include Cu. The differences in characteristics of the composition of the protection layer 210 (or the organometallic protection layer) and the composition of metal oxide layers can be identified by X-ray photoelectron spectroscopy (XPS), electron paramagnetic resonance (EPR), or the like. For example, XPS and EPR can characterize the coordination environment of metals in the protection layer 210.

In some embodiments, the protection layer 220 covers an external surface of the conductive pad 120. The external surface of the conductive pad 120 of the electronic component 100 may include an upper surface 121 and a lateral surface 122 protruded out of the surface 102 of the electronic component 100. In some embodiments, the surface 102 of the electronic component 100 is exposed from the protection layer 220. In some embodiments, the protection layer 220 is conformal with the external surface (e.g., the upper surface 121 and the lateral surface 122) of the conductive pad 120 of the electronic component 100. In some embodiments, the protection layer 220 defines an opening 220C exposing a portion of the conductive pad 120. In some embodiments, the protection layer 220 is embedded in the substrate 10.

In some embodiments, the protection layer 220 has a substantially uniform thickness. In some embodiments, the thickness T2 of the protection layer 220 may be from about 0.1 µm to about 0.3 µm. In some embodiments, an average surface roughness Ra of the external surface (e.g., the upper surface 121 and the lateral surface 122) of the conductive pad 120 may be from about 1.2 µm to about 2.5 µm. In some embodiments, an average surface roughness Ra of the external surface (e.g., the upper surface 121 and the lateral surface 122) of the conductive pad 120 may be from about 1.3 µm to about 1.8 µm. In some embodiments, the protection layer 220 includes an organometallic protection layer. In some embodiments, the protection layer 220 includes an organometallic complex. In some embodiments, the protection layer 220 is formed of one or more organometallic complexes. In some embodiments, the organometallic complex may include a Cu-imidazole complex. In some embodiments, the protection layer 220 includes an organic solderability preservative (OSP) material. In some embodiments, the conductive pad 120 and the organometallic complex of the protection layer 220 include a same metal. For example, the conductive pad 120 and the organometallic complex of the protection layer 220 both include Cu. In some embodiments, the electronic component 100 with the protection layer 210 and/or 220 form a semiconductor device of the semiconductor device package 1.

The filling material 300 may be disposed or formed in the cavity 10C encapsulating the electronic component 100. The filling material 300 may encapsulate sidewalls of the electronic component 100. The filling material 300 may further encapsulate the surface 101 and the surface 102 of the electronic component 100. The filling material 300 may partially encapsulate the conductive pads 110 and 120. In some embodiments, the filling material 300 and the conductive pad 110 are separated by an element G1. In some embodiments, the element G1 that separates the filling material 300 from the conductive pad 110 includes the protection layer 210 in a gap between the filling material 300 and the conductive pad 110. In some embodiments, the thickness T1 of the protection layer 210 may be a spacing or a distance of the gap between the filling material 300 and the conductive pad 110. In some embodiments, the filling material 300 and the conductive pad 120 are separated by an element G2. In some embodiments, the element G2 that separates the filling material 300 from the conductive pad 210 includes the protection layer 220 in a gap. The filling material 300 may include resin (e.g., epoxy resin), ink (e.g. Ajinomoto build-up film (ABF) ink), a molding compound (e.g., an epoxy molding compound or other molding compound), polyimide, a phenolic compound or material, or a combination thereof. The filling material 300 may have no fillers. Alternatively, the filling material 300 may have fillers with a size of 1-2 micrometers or less.

The conductive via 410 may be on the upper surface 111 of the conductive pad 110. In some embodiments, the conductive via 410 penetrates through the protection layer 210. In some embodiments, an upper surface 411 of the conductive via 410 may be exposed from the filling material 300, and a bottom surface 412 of the conductive via 410 may directly or physically contact the conductive pad 110. In some embodiments, the element G1 that separates the filling material 300 from the conductive pad 110 contacts a portion of the conductive via 410. In some embodiments, the protection layer 210 directly contacts or physically contacts the conductive via 410. In some embodiments, an interface between the conductive via 410 and the filling material 300 and an interface between the conductive via 410 and the protection layer 210 form a continuous surface.

The conductive via 420 may be on the upper surface 121 of the conductive pad 120. In some embodiments, the conductive via 420 penetrates through the protection layer 220. In some embodiments, a portion of the conductive via 420 contacts the element G2. In some embodiments, the protection layer 220 directly contacts or physically contacts the conductive via 420. In some embodiments, an interface between the conductive via 420 and the filling material 300 and an interface between the conductive via 420 and the protection layer 220 form a continuous surface. In some embodiments, the conductive vias 410 and 220 may be or may include Au, Ag, Al, Cu, or an alloy thereof.

The circuit layer 500 may be disposed on the substrate 10. In some embodiments, the circuit layer 500 is disposed on the upper surface 10A of the substrate 10 and spaced apart from the protection layer 210. In some embodiments, the circuit layer 500 is electrically connected to the electronic component 100. In some embodiments, the conductive via 410 penetrates through the protection layer 210 and electrically connects the circuit layer 500 to the conductive pad 110 of the electronic component 100. In some embodiments, the circuit layer 500 may include a substrate-level circuit layer, which is a low-density circuit layer with a wider line width/line space (L/S). For example, the L/S of the circuit layer 500 may be equal to or greater than about 10 μm/about 10 μm.

The circuit layer 510 may be disposed on the substrate 10. In some embodiments, the circuit layer 510 is disposed on the bottom surface 10B of the substrate 10 and spaced apart from the protection layer 220. In some embodiments, the circuit layer 510 is electrically connected to the electronic component 100. In some embodiments, the conductive via 420 penetrates through the protection layer 220 to electrically connect the circuit layer 510 to the conductive pad 120 of the electronic component 100. In some embodiments, the circuit layer 510 may include a substrate-level circuit layer, which is a low-density circuit layer with a wider L/S. For example, the L/S of the circuit layer 510 may be equal to or greater than about 10 μm/about 10 μm. In some embodiments, the circuit layers 500 and 510 may be or may include Au, Ag, Al, Cu, or an alloy thereof.

According to some embodiments of the present disclosure, with the conductive pads 110 and 120 covered by the protection layers 210 and 220, contamination and/or oxidation of conductive pads of the electronic component 100 exposed to air or an exterior environment prior to encapsulation can be effectively prevented. Therefore, the electrical connection provided by the conductive pads 110 and 120 as well as the reliability of the semiconductor device package 1 can be relatively satisfactory. In addition, the exterior appearances of the conductive pads 110 and 120 are not contaminated by contamination and/or native oxides, and thus the pick and place device can identify the electronic component 100 correctly, thereby the pick and place accuracy of the electronic component 100 during the manufacturing process can be improved.

Moreover, according to some embodiments of the present disclosure, since the protection layers 210 and 220 are formed on the conductive pads 110 and 120 prior to incorporating the electronic component 100 into the semiconductor device package 1 rather than after incorporating the electronic component 100 into the semiconductor device package 1, and thus operations for cleaning off the contamination and/or native oxides from the conductive pads 110 and 120 after connecting the electronic component 100 to the substrate 10 can be omitted. Therefore, issues of components falling off, components shifting away from predetermined positions, and incomplete cleaning of the conductive pads due to the conductive pads partially covered by other components can be avoided.

In addition, according to some embodiments of the present disclosure, the protection layers 210 and 220 may be or may include organometallic protection layers, such organometallic characteristics render the protection layers 210 and 220 relatively vulnerable to thermal decomposition, and thus through vias penetrating through the protection layers 210 and 220 can be formed relatively easily, e.g., by thermal treatments. For example, through vias may be formed by a relatively low-temperature thermal treatment, thus the cost is reduced, and possible damages, which could have been caused a high temperature operation, to existing structures and/or components of the intermediate package structure can be prevented. Moreover, for example, through vias penetrating through the protection layers 210 and 220 may be formed in the same operation for forming through vias penetrating through the filling material 300, and thus the manufacturing process can be further simplified.

Figure 2A:
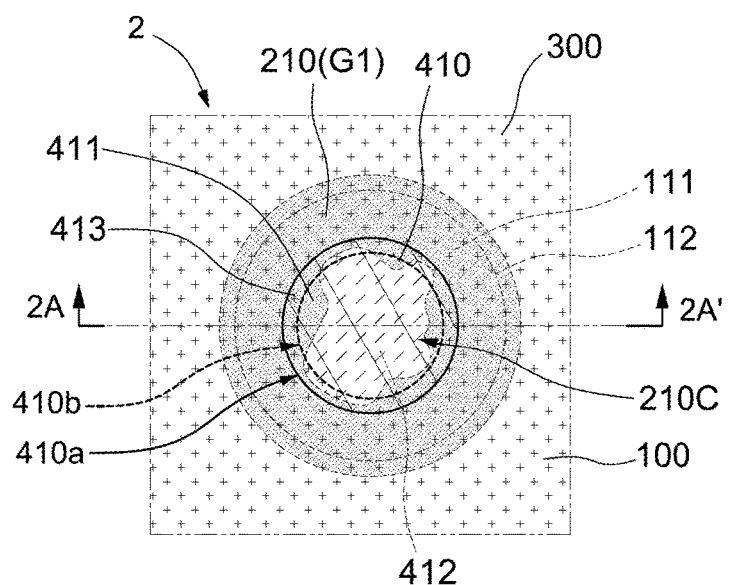
FIG. 2A illustrates a top view of a portion of a semiconductor device package in accordance with some embodiments of the present disclosure.

FIG. 2A illustrates a top view of a portion of a semiconductor device package in accordance with some embodiments of the present disclosure. In some embodiments, FIG. 2A illustrates a top view of a portion 2 of the semiconductor device package 1 in FIG. 1.

In some embodiments, the conductive via 410 may have a tapered structure including an opening 410a and an opening 410b having different sizes. In some embodiments, a size or a projection area of the opening 410a is greater than a size or a protection area of the opening 410b. In some embodiments, the opening 410a defines the upper surface 411 of the conductive via 410. In some embodiments, the opening 410b is above the opening 210C of the protection layer 210. In some embodiments, the opening 210C of the protection layer 210 defines the bottom surface 412 of the conductive via 410. In some embodiments, the bottom surface 412 of the conductive via 410 has an irregular shape. In some embodiments, the bottom surface 412 of the conductive via 410 is outflanked by the element G1 that separates the filling material 300 from the conductive pad 110. In some embodiments, the bottom surface 412 of the conductive via 410 is surrounded by the element G1. In some embodiments, the protection layer 210 surrounds a portion of the conductive via 410. In some embodiments, the protection layer 210 defines an opening 210C exposing a portion of the conductive pad 110. In some embodiments, the opening 210C of the protection layer 210 has an irregular shape. In some embodiments, the opening 210C may be formed by thermal decomposition of the organometallic composition of the protection layer 210, and thus the opening 210C may be formed of an irregular shape.

In some embodiments, a projection of the protection layer 210 overlaps a projection of a peripheral region of the conductive via 410 from a top view perspective. In some embodiments, the protection layer 210 surrounds a lateral surface 413 of the conductive via 410. In some embodiments, a projection of the protection layer 210 overlaps a portion of a projection of the lateral surface 413 of the conductive via 410. In some embodiments, a projection of the protection layer 210 overlaps a portion of a projection of the bottom surface 412 of the conductive via 410. In some embodiments, a portion of the profile (or outline) of the opening 210C of the protection layer 210 is located outside of the opening 410b of the conductive via 410 from a top view perspective, and a portion of the profile (or outline) of the opening 210C of the protection layer 210 is located inside of the opening 410b of the conductive via 410 from a top view perspective. In some embodiments, a portion of the opening 210C of the protection layer 210 exceeds or protrudes out of the opening 410b of the conductive via 410 from a top view perspective, while a portion of the opening 410b of the conductive via 410 is free from overlapping the opening 210C of the protection layer 210 from a top view perspective.

Figure 2B:
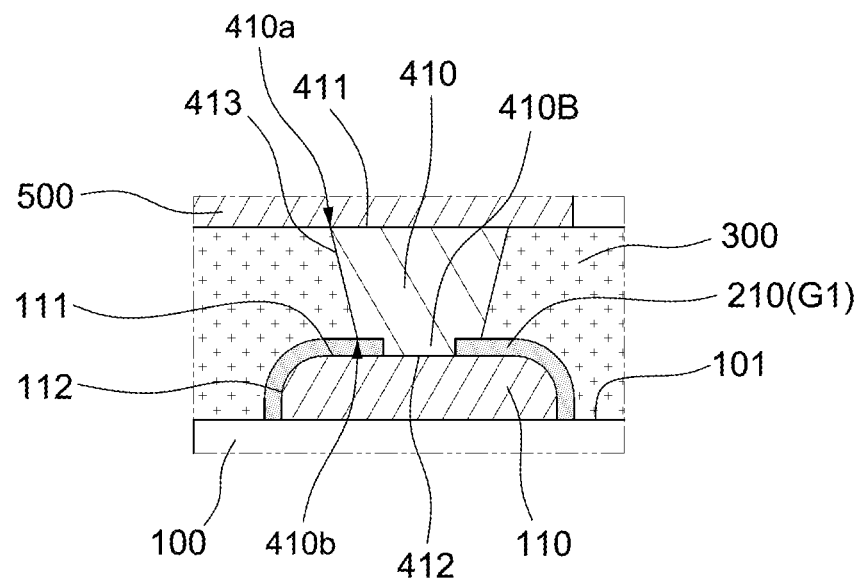
FIG. 2B illustrates a cross-sectional view of a portion of a semiconductor device package in accordance with some embodiments of the present disclosure.

FIG. 2B illustrates a cross-sectional view of a portion of a semiconductor device package in accordance with some embodiments of the present disclosure. In some embodiments, FIG. 2B illustrates a cross-sectional view of a portion 2 of the semiconductor device package 1 along a cross-sectional line 2A-2A' in FIG. 1.

In some embodiments, a bottom portion 410B of the conductive via 410 contacts the element G1. In some embodiments, the opening 410b defines an interface between the bottom portion 410B of the conductive via 410 and the remaining portion of the conductive via 410. In some embodiments, at least a portion of the bottom portion 410B of the conductive via 410 is recessed from a lateral surface 413 of the conductive via 410. In some embodiments, the conductive via 410 includes a stepped structure contacting the conductive pad 110 of the electronic component 100. In some embodiments, the bottom portion 410B of the conductive via 410 has a stepped structure. In some embodiments, the stepped structure of the conductive via 410 includes the bottom portion 410B.

Figure 2C:
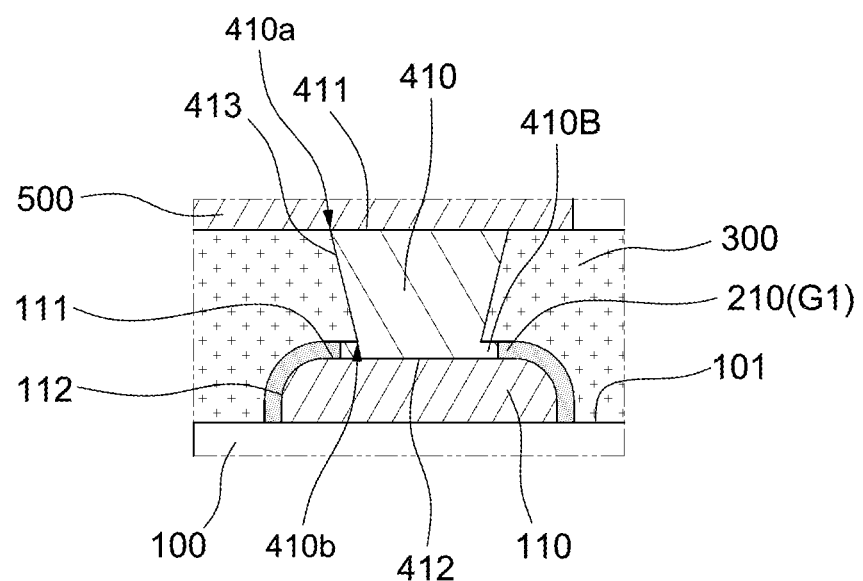
FIG. 2C illustrates a cross-sectional view of a portion of a semiconductor device package in accordance with some embodiments of the present disclosure.

FIG. 2C illustrates a cross-sectional view of a portion of a semiconductor device package in accordance with some embodiments of the present disclosure. In some embodiments, FIG. 2C illustrates a cross-sectional view of a portion 2 of the semiconductor device package 1 in FIG. 1.

In some embodiments, at least a portion of a bottom portion 410B of the conductive via 410 is protruded out of a lateral surface 413 of the conductive via 410. In some embodiments, the bottom portion 410B of the conductive via 410 directly or physically contacts the filling material 300. In some embodiments, the conductive via 410 includes a stepped structure contacting the conductive pad 110 of the electronic component 100. In some embodiments, the stepped structure of the conductive via 410 includes the bottom portion 410B. In some embodiments, at least a portion of the bottom portion 410B of the conductive via 410 is conformal with the opening 210C of the protection layer 210. In some embodiments, referring to FIG. 2A, while the bottom surface 412 of the conductive via 410 has an irregular shape, the at least a portion of the bottom portion 410B of the conductive via 410 has an irregular shape accordingly.

Figure 3:
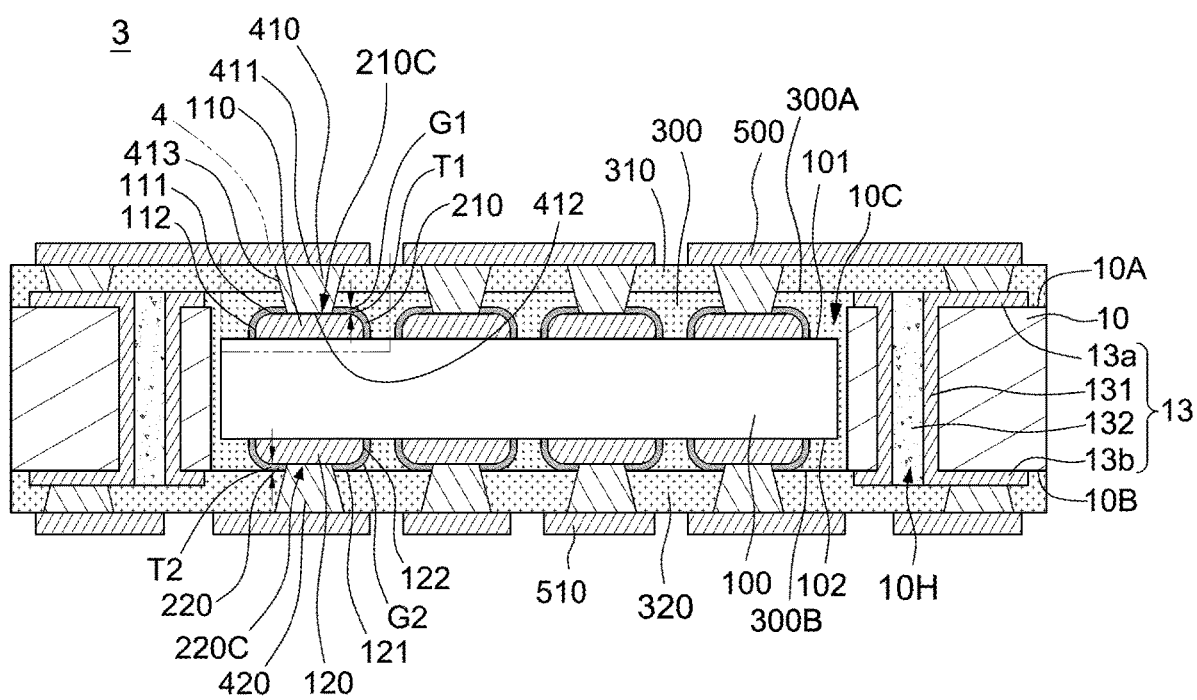
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1 except that, for example, the semiconductor device package 3 further includes dielectric layers 310 and 320.

In some embodiments, the dielectric layer 310 and 320 are over the upper surface 10A and the bottom surface 10B of the substrate 10, respectively. In some embodiments, the dielectric layers 310 and 320 are on the filling material 300. In some embodiments, the dielectric layer 310 and 320 are over the surface 300A and the surface 300B of the filling material 300, respectively. In some embodiments, the conductive via 410 penetrates through the dielectric layer 310 and the filling material 300 to contact the conductive pad 110 of the electronic component 100. In some embodiments, the conductive via 420 penetrates through the dielectric layer 320 to contact the conductive pad 120 of the electronic component 100. In some embodiments, the dielectric layer 320 and the conductive pad 120 are separated by an element G2. In some embodiments, the element G2 that separates the dielectric layer 320 from the conductive pad 120 includes the protection layer 220 in a gap between the dielectric layer 320 and the conductive pad 120. In some embodiments, the thickness T2 of the protection layer 220 may be a spacing or a distance of the gap between the dielectric layer 320 and the conductive pad 120. In some embodiments, the dielectric layers 310 and 320 each includes a dielectric laminate. The dielectric laminate may be or include a bismaleimide triazine (BT) laminate, an ABF laminate, or the like. The dielectric laminate may include fillers or glass fibers. For example, the dielectric layers 310 and 320 may be ABF laminates including fillers.

Figure 4A:
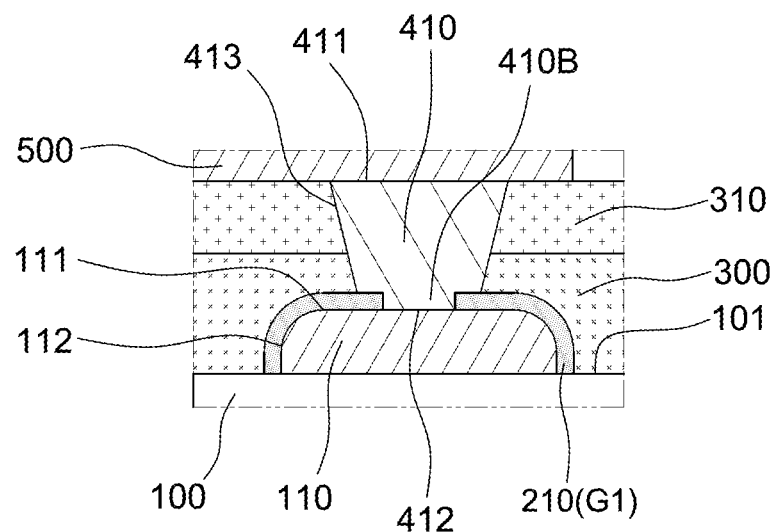
FIG. 4A illustrates a cross-sectional view of a portion of a semiconductor device package in accordance with some embodiments of the present disclosure.

FIG. 4A illustrates a cross-sectional view of a portion of a semiconductor device package in accordance with some embodiments of the present disclosure. In some embodiments, FIG. 4A illustrates a cross-sectional view of a portion 4 of the semiconductor device package 3 in FIG. 3. In some embodiments, the structure in FIG. 4A is similar to that in FIG. 2B, except that, for example, the conductive via 410 penetrates through the dielectric layer 310 and the filling material 300 to contact the conductive pad 110.

Figure 4B:
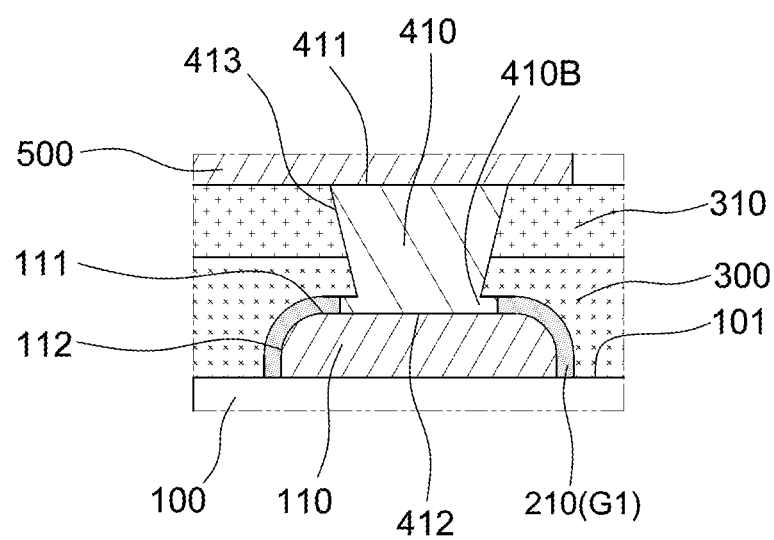
FIG. 4B illustrates a cross-sectional view of a portion of a semiconductor device package in accordance with some embodiments of the present disclosure.

FIG. 4B illustrates a cross-sectional view of a portion of a semiconductor device package in accordance with some embodiments of the present disclosure. In some embodiments, FIG. 4B illustrates a cross-sectional view of a portion 4 of the semiconductor device package 3 in FIG. 3. In some embodiments, the structure in FIG. 4B is similar to that in FIG. 2C, except that, for example, the conductive via 410 penetrates through the dielectric layer 310 and the filling material 300 to contact the conductive pad 110.

Figure 4C:
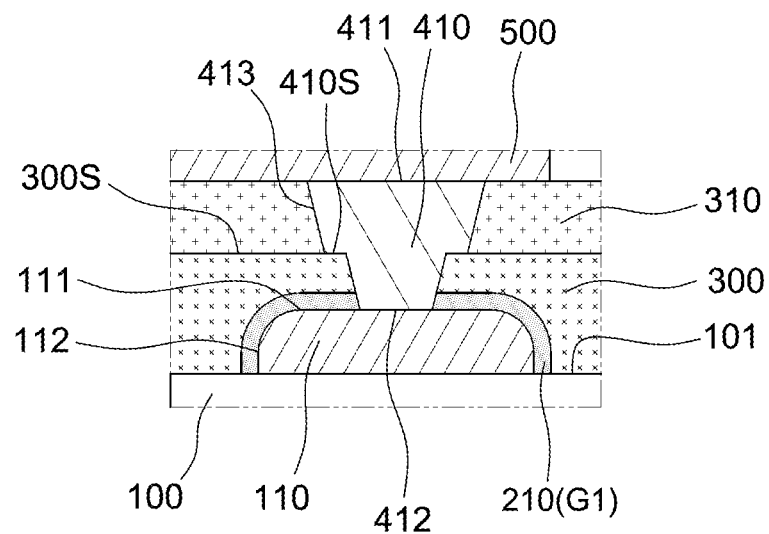
FIG. 4C illustrates a cross-sectional view of a portion of a semiconductor device package in accordance with some embodiments of the present disclosure.

FIG. 4C illustrates a cross-sectional view of a portion of a semiconductor device package in accordance with some embodiments of the present disclosure. In some embodiments, FIG. 4C illustrates a cross-sectional view of a portion 4 of the semiconductor device package 3 in FIG. 3.

In some embodiments, the conductive via 410 includes a stepped structure. In some embodiments, a stepped surface 410S of the stepped structure of the conductive via 410 is substantially coplanar with an interface 300S between the filling material 300 and the dielectric layer 310. In some embodiments, the stepped surface 410S of the stepped structure of the conductive via 410 directly or physically contacts the filling material 300. In some embodiments, the filling material 300 and the dielectric layer 310 may be formed of or include different materials, have different thermal conductive abilities, and/or include different amounts of fillers. Due to the difference in materials and/or properties, the filling material 300 and the dielectric layer 310 have different abilities to absorb energy and thus have different decomposition properties (e.g., thermal decomposition rates), so as to form the stepped structure. In some embodiments, the stepped structure of the conductive via 410 may be formed by multiple laser drilling operations on the filling material 300 and the dielectric layer 310. The multiple laser drilling operations may be performed with different parameters, e.g., applying different energies, under different temperatures, and etc., so as to exert different influences onto the filling material 300 and the dielectric layer 310, thereby forming the stepped structure. In some embodiments, the conductive via 410 may further include a bottom portion 410B (not shown in FIG. 4C) recessed from or protruded out of a lateral surface 413 of the conductive via 410, as illustrated in FIG. 4A or FIG. 4B.

Figure 4D:
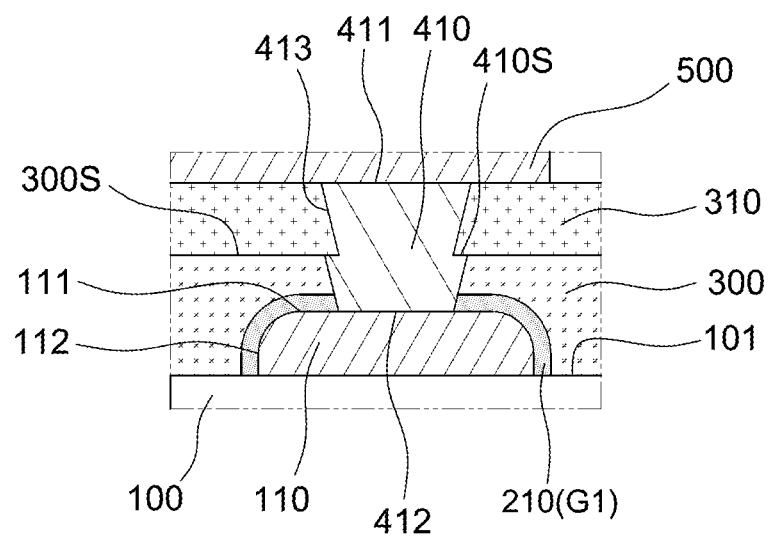
FIG. 4D illustrates a cross-sectional view of a portion of a semiconductor device package in accordance with some embodiments of the present disclosure.

FIG. 4D illustrates a cross-sectional view of a portion of a semiconductor device package in accordance with some embodiments of the present disclosure. In some embodiments, FIG. 4D illustrates a cross-sectional view of a portion 4 of the semiconductor device package 3 in FIG. 3.

In some embodiments, the conductive via 410 includes a stepped structure. In some embodiments, a stepped surface 410S of the stepped structure of the conductive via 410 is substantially coplanar with an interface 30S between the filling material 300 and the dielectric layer 310. In some embodiments, the stepped surface 410S of the stepped structure of the conductive via 410 directly or physically contacts the dielectric layer 310. In some embodiments, the filling material 300 and the dielectric layer 310 may be formed of or include different materials, have different thermal conductive abilities, and/or include different amount of fillers. Due to the difference in materials and/or properties, the filling material 300 and the dielectric layer 310 have different abilities to absorb energy and thus have different decomposition properties (e.g., thermal decomposition rates), so as to form the stepped structure. In some embodiments, the conductive via 410 may further include a bottom portion 410B (not shown in FIG. 4C) recessed from or protruded out of a lateral surface 413 of the conductive via 410, as illustrated in FIG. 4A or FIG. 4B.

Figure 5:
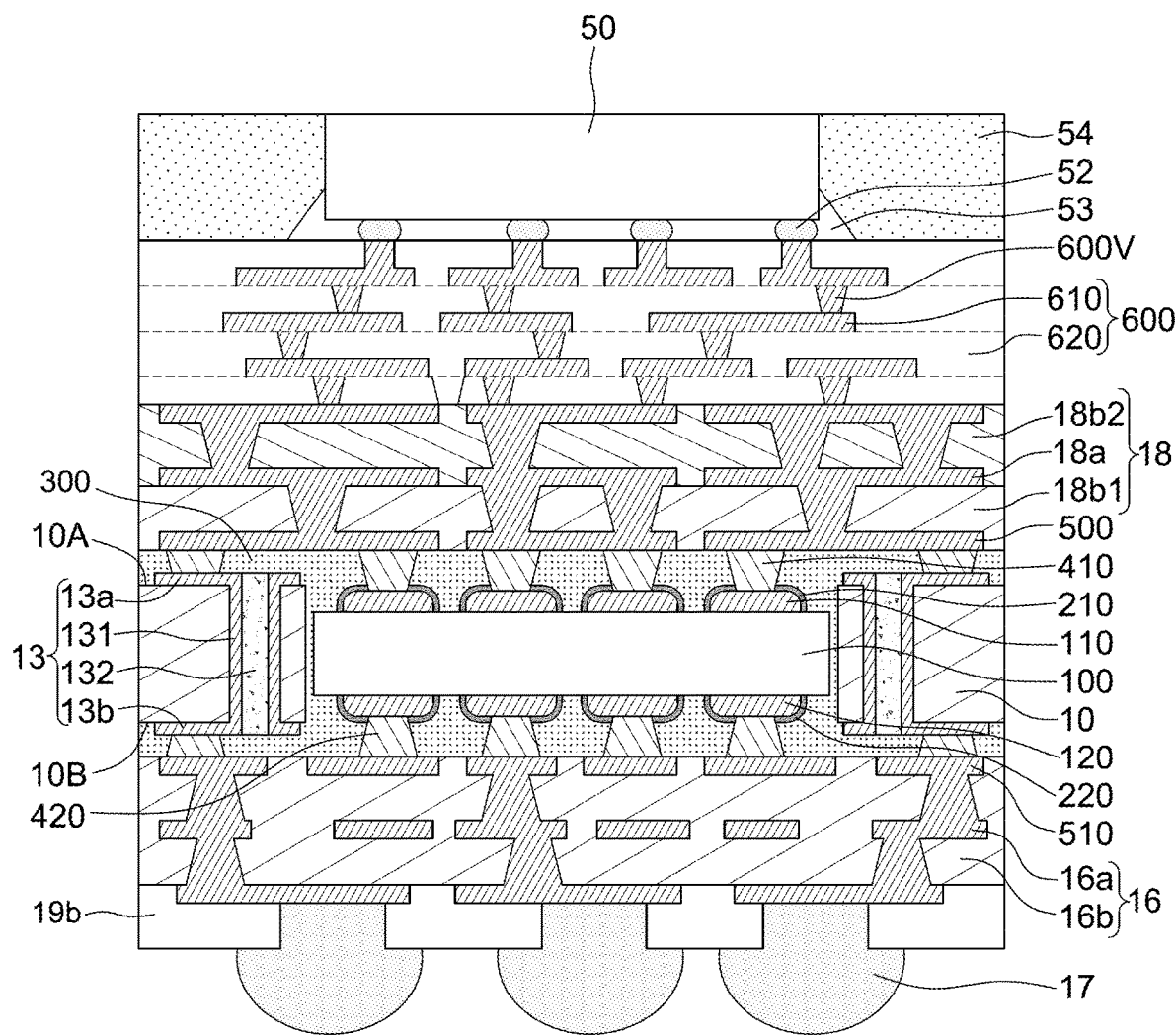
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 1 in FIG. 1, and the differences therebetween are described as follows.

The semiconductor device package 5 may further include a bottom redistribution layer (RDL) 16 disposed on the bottom surface 10B of the substrate 10 and electrically connected to the circuit layer 510. The bottom RDL 16 may include one or more wiring layers 16a, and one or more dielectric layers 16b stacked to each other. The L/S of the bottom RDL 16 may be substantially equal to or larger than that of the circuit layer 500. In some embodiments, the bottom RDL 16 includes a substrate-level RDL, which is a low-density RDL with wider L/S. For example, the L/S of the bottom RDL 16 may be equal to or greater than about 10 μm/about 10 μm. The wiring layer 16a may be or may include Au, Ag, Al, Cu, or an alloy thereof. The dielectric layer 16b may include an organic dielectric layer, such as a BT laminate, and the BT laminate may include glass fibers. The BT laminate may serve as a reinforcing layer for the bottom RDL 16.

In some embodiments, one or more electrical conductors 17 such as solder balls may be disposed on and electrically connected to the bottom RDL 16 to facilitate external electrical connection. For example, the electrical conductors 17 may be further bonded to a circuit board such as a printed circuit board (PCB) or the like.

The semiconductor device package 5 may further include an upper RDL 18 disposed on the upper surface 10A of the substrate 10 and electrically connected to the circuit layer 500. The upper RDL 18 may include one or more wiring layers 18a, and one or more dielectric layers 18b1 and 18b2 stacked to each other. The L/S of the upper RDL 18 may be substantially equal to or larger than that of the circuit layer 510. In some embodiments, the upper RDL 18 includes a substrate-level RDL, which is a low-density RDL with wider L/S. For example, the L/S of the upper RDL 18 may be equal to or greater than about 10 μm/about 10 μm. The wiring layer 18a may be or may include Au, Ag, Al, Cu, or an alloy thereof. The dielectric layer 18b1 may include an organic dielectric layer, such as a BT laminate, and the BT laminate may include glass fibers. The BT laminate may serve as a reinforcing layer for the upper RDL 18. The dielectric layer 18b2 may include an ABF, and the ABF may be free of glass fibers.

The semiconductor device package 5 may further include a circuit layer 600 over the upper surface 10A of the substrate 10. In some embodiments, the circuit layer 600 is electrically connected to the circuit layer 500. In some embodiments, the circuit layer 600 may include at least one conductive wiring pattern 610 and at least one dielectric layer 620 stacked to each other. In some embodiments, the conductive wiring pattern 610 may include a plurality of conductive vias 600V. The conductive via 600V may have an inversed trapezoid cross-sectional shape. A bottommost conductive wiring pattern 610 may be exposed from a bottommost dielectric layer 620 and electrically connected to the upper RDL 18.

In some embodiments, the circuit layer 600 may be built up on the upper RDL 18 layer by layer. For example, the circuit layer 600 may be formed on the upper RDL 18 by various operations including deposition such as electroplating, patterning such as photolithography and/or etching, planarization such as grinding, and the like. In some embodiments, the conductive wiring pattern 610 may include metal such as Au, Ag, Al, Cu, or an alloy thereof, which can be formed by electroplating. The dielectric layer 620 may include a photo-sensitive material, which can be patterned by photolithography. The joint between the upper RDL 18 and the bottommost conductive wiring pattern 610 of the circuit layer 600 may be a solder-free joint. By way of example, the bottommost conductive wiring pattern 610 of the circuit layer 600 may be directly extended from the wiring layer 18a of the upper RDL 18. In other words, the circuit layer 600 of some embodiments is not a pre-formed circuit layer bonded to the upper RDL 18. An uppermost conductive wiring pattern 610 may be disposed on, adjacent to, or embedded in and exposed by an uppermost dielectric layer 620 for further electrical connection. The L/S of the circuit layer 600 may be lower than that of the upper RDL 18 and/or the circuit layer 500. The circuit layer 600 may include a bumping-level circuit layer, which is a high-density circuit layer with a narrower L/S. For example, the L/S of the circuit layer 600 may be between about 2 µm/about 2 µm and about 10 µm/about 10 µm, or less than about 2 µm/about 2 µm. The conductive wiring pattern 610 may include a bumping-level RDL, which is a high-density RDL with narrower L/S. For example, the L/S of the conductive wiring pattern 610 may be between about 2 µm/about 2 µm and about 10 µm/about 10 µm, or less than about 2 µm/about 2 µm. By way of example, the structure of the circuit layer 600 may be a fan-out (FO) structure.

The semiconductor device package 5 may further include at least one electronic component 50 disposed on and electrically connected to the circuit layer 600. In some embodiments, the electronic component 50 may include an active electronic component. By way of example, the active electronic component may include an integrated circuit (IC) component such as an application specific IC (ASIC), a memory component, or a combination thereof. Conductive bumps 52 may be disposed between the electronic component 50 and the circuit layer 600 to electrically connect the electronic component 50 to the circuit layer 600. The conductive bumps 52 may include solder bumps (e.g., micro bumps) or other suitable conductors. In some embodiments, an underfill layer 53 may be disposed between the electronic component 50 and the circuit layer 600 and surrounding the conductive bumps 52. The active electronic component such as the electronic component 50 is vertically stacked on the passive electronic component such as the electronic component 100. Accordingly, signal transmission path between the passive electronic component and the active electronic component can be shortened, and energy loss during signal transmission can be reduced. In addition, power consumption can be lowered, and performance can be improved.

An encapsulation layer 54 may be disposed on the circuit layer 600 to encapsulate the electronic component 50. In some embodiments, the encapsulation layer 54 may encapsulate sidewalls of the electronic component 50 and expose an upper surface of the electronic component 50. Alternatively, the encapsulation layer 54 may encapsulate the sidewalls and the upper surface of the electronic component 50.

In some embodiments, the combined structure including the substrate 10, the circuit layers 500 and 510, the upper RDL 18, and the bottom RDL 16 may be also referred to as "a low-density conductive structure" or "a low-density stacked structure", and the structure of the circuit layer 600 may be also referred to as "a high-density conductive structure" or "a high-density stacked structure." The line width/line space (L/S) of the circuit layer 600 may be less than an L/S of the circuit layers 500 and 510. By way of example, the L/S of the circuit layer 600 may be between about 2 µm/about 2 µm and about 10 µm/about 10 µm, and the L/S of the circuit layers 500 and 510 may be equal to or greater than about 10 µm/about 10 µm. The high-density conductive structure may be configured as fan-out circuit to electrically connect the electronic component 50 with more I/O connections, and to redistribute the I/O connections to the low-density conductive structure. The low-density conductive structure may be configured to transmit the redistributed I/O connections from the circuit layer 600 to a PCB.

Figure 6:
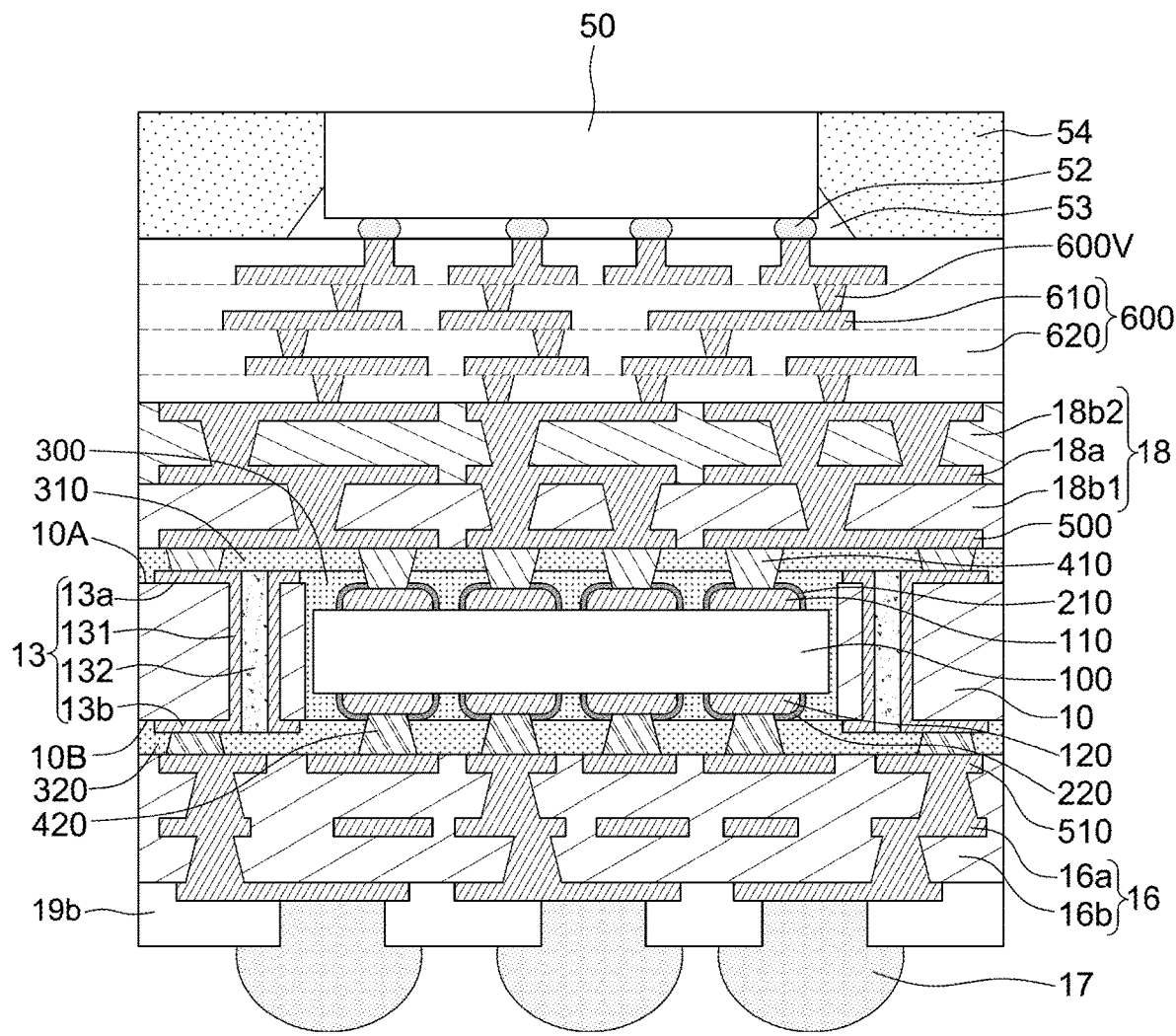
FIG. 6 illustrates a cross-sectional view of a semiconductor device package in accordance with some embodiments of the present disclosure.

FIG. 6 illustrates a cross-sectional view of a semiconductor device package 6 in accordance with some embodiments of the present disclosure. The semiconductor device package 6 is similar to the semiconductor device package 5 in FIG. 5 except that, for example, the semiconductor device package 6 further includes dielectric layers 310 and 320.

In some embodiments, the circuit layer 500 is on the dielectric layer 310. Portions of an upper surface of the dielectric layer 310 may be exposed from the circuit layer 500. In some embodiments, the circuit layer 510 is on the dielectric layer 320. Portions of an upper surface of the dielectric layer 320 may be exposed from the circuit layer 510.

FIG. 7A, FIG. 7B, FIG. 7C, FIG. 7D, FIG. 7E, FIG. 7F, FIG. 7G, FIG. 7H, FIG. 7I, FIG. 7J, FIG. 7K, and FIG. 7L illustrate various operations in a method of manufacturing a semiconductor device package 5 in accordance with some embodiments of the present disclosure.

Figure 7A:
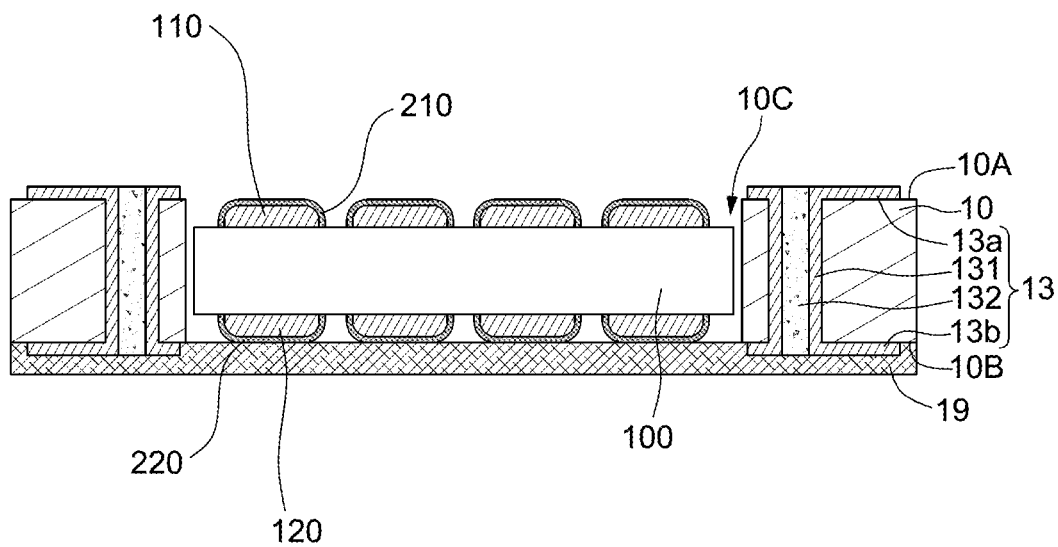
FIG. 7A, FIG. 7B, FIG. 7C, FIG. 7D, FIG. 7E, FIG. 7F, FIG. 7G, FIG. 7H, FIG. 7I, FIG. 7J, FIG. 7K, and FIG. 7L illustrate various operations in a method of manufacturing a semiconductor device package in accordance with some embodiments of the present disclosure.

Referring to FIG. 7A, a substrate 10 having a cavity 10C may be disposed on a carrier 19, at least one protection layer 210 may be formed on at least one conductive pad 110 of an electronic component 100, at least one protection layer 220 may be formed on at least one conductive pad 120 of the electronic component 100, and the electronic component 100 may be disposed in the cavity 10C of the substrate 10. In some embodiments, the electronic component 100 is disposed in the cavity 10C on the carrier 19. In some embodiments, the carrier 19 may be or include a tape.

The substrate 10 including at least one interconnection via 13 and having the cavity 10C may be formed by the following operations. In some embodiments, a substrate 10 is provided, at least one through hole 10H is formed to penetrate through the substrate 10, and at least one interconnection via 13 is formed in the through hole 10H. The interconnection via 13 may include a base conductive layer 131 and an insulation material 132. The base conductive layer 131 may be disposed or formed on a side wall of the through hole 10H. The insulation material 132 may fill in the through hole 10H. In some embodiments, the interconnection via 13 may further include an upper conductive pad 13a and a bottom conductive pad 13b respectively disposed on the upper surface 10A and the bottom surface 10B of the substrate 10 and electrically connected to the base conductive layer 131. In some embodiments, the cavity 10C is formed in the substrate 10. In some embodiments, the cavity 10C is a through cavity that penetrates through the substrate 10. In some other embodiments, the cavity 10C may be a recess that recesses from the upper surface 10A without penetrating through the substrate 10. In some embodiments, the substrate 10 is disposed on or bonded to the carrier 19. In some embodiments, the carrier 19 may be or include a tape. In some embodiments, a portion of the interconnection via 13 protruded out of the bottom surface 10B of the substrate 10 is extended into the carrier 19.

In some embodiments, the protection layer 210 may be formed on the conductive pad 110 by following operations. An external surface of the conducive pad 110 may be cleaned with a cleaning reagent, and the cleaning reagent may include a surfactant. Organic contaminants and/or inorganic contaminants on the external surface of the conductive pad 110 may be removed by the cleaning reagent. Next, a micro-etching operation may be performed on the external surface of the conductive pad 110. The micro-etching operation serves to remove native oxides originally formed on the external surface of the conductive pad 110. The etchant used in the micro-etching operation may include a mixed aqueous solution including sulfuric acid and hydrogen peroxide, an aqueous solution including sodium persulfate (SPS), or the like. After the micro-etching operation is completed, an exterior thin layer of the conductive pad 110 may be removed by the etchant, reducing the thickness of the conductive pad 110 by about 0.3 µm to about 0.7 µm. Then, a coordination complex may be provided onto the external surface of the conductive pad 110 to react with a metal of the conductive pad 110, so as to form an organometallic complex. The metal ions of the conductive pad 110 may dissociate in an acidic solvent to react with the coordination complex to form the organometallic complex, and the as-formed molecules of the organometallic complex are deposited onto the external surface of the conductive pad 110 layer-by-layer so as to form the protection layer 210. In some embodiments, the micro-etching operation is performed on the external surface of the conductive pad 110 prior to providing the coordination complex onto the external surface of the conductive pad 110. Next, the electronic component 110 including the conductive pad 110 with the protection layer 210 formed thereon is dried under a temperature lower than about 100° C. For example, the protection layer 210 may be dried by a wind knife at room temperature followed by being placed in an oven under a temperature from about 60° C. to about 100° C.

In some embodiments, since the protection layer 210 is formed from reacting a coordination complex with the metal of the conductive pad 110, the protection layer 210 is formed only on the external surface of the conductive pad 110, and the surfaces 101 and 102 are free of the protection layer 210. Similar rationale may apply to the protection layer 220. In some embodiments, the protection layer 220 may be formed by operations similar to those for forming the protection layer 210.

Figure 7B:
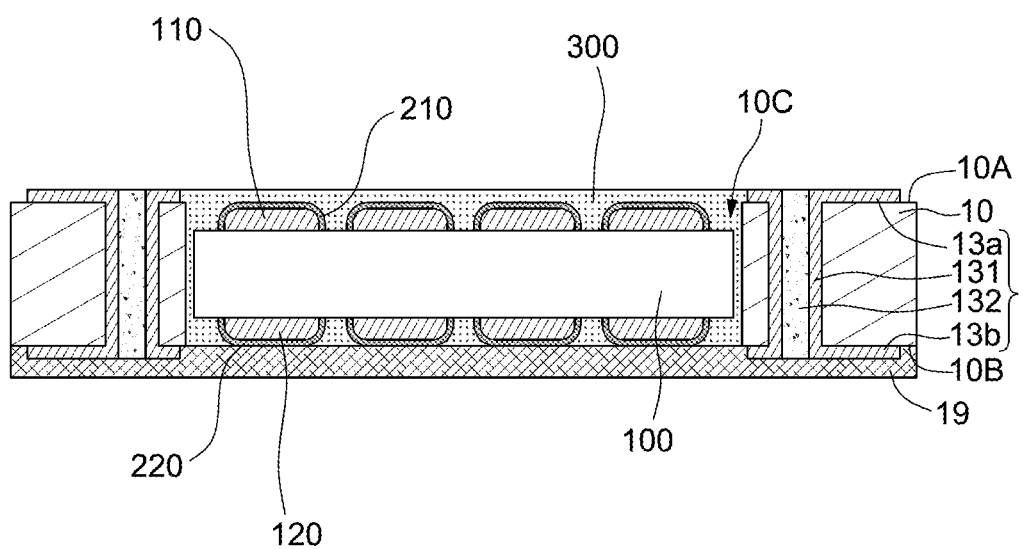

Referring to FIG. 7B, the protection layer 210 and the electronic component 100 may be encapsulated with a filling material 300 in the cavity 10C of the substrate 10. In some embodiments, the protection layer 220 facing the carrier 19 is in direct or physical contact with the carrier 19. In some embodiments, the protection layer 220 is encapsulated with the filling material 300 in the cavity 10C of the substrate 10.

Figure 7C:
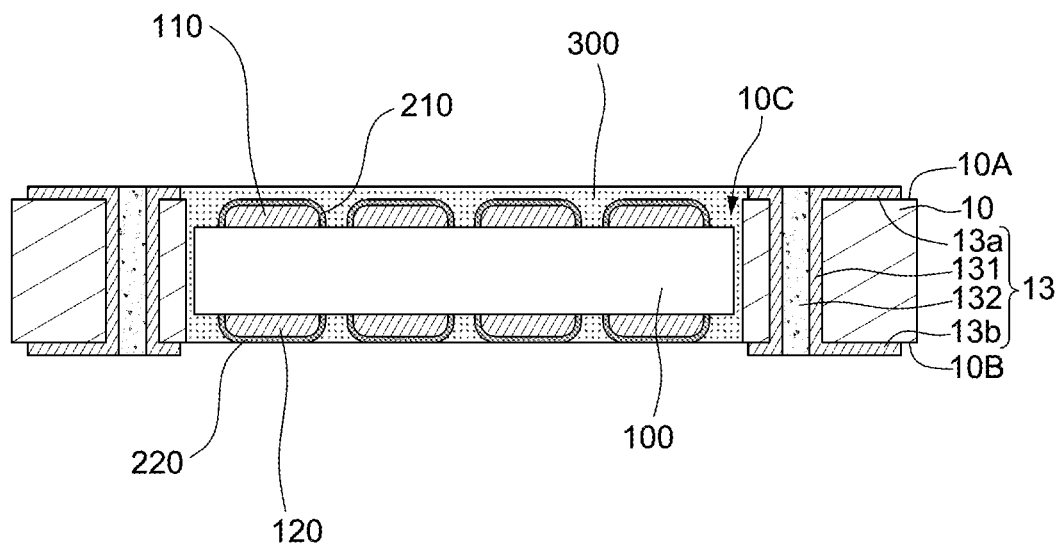

Referring to FIG. 7C, the carrier 19 may be removed from the substrate 10. In some embodiments, the carrier 19 is removed after the protection layers 210 and 220 and the electronic component 100 are encapsulated with the filling material 300. In some embodiments, the protection layer 210 is fully covered and encapsulated by the filling material 300. In some embodiments, an upper surface of the protection layer 220 is exposed from the filling material 300 after the carrier 19 is removed.

Figure 7D:
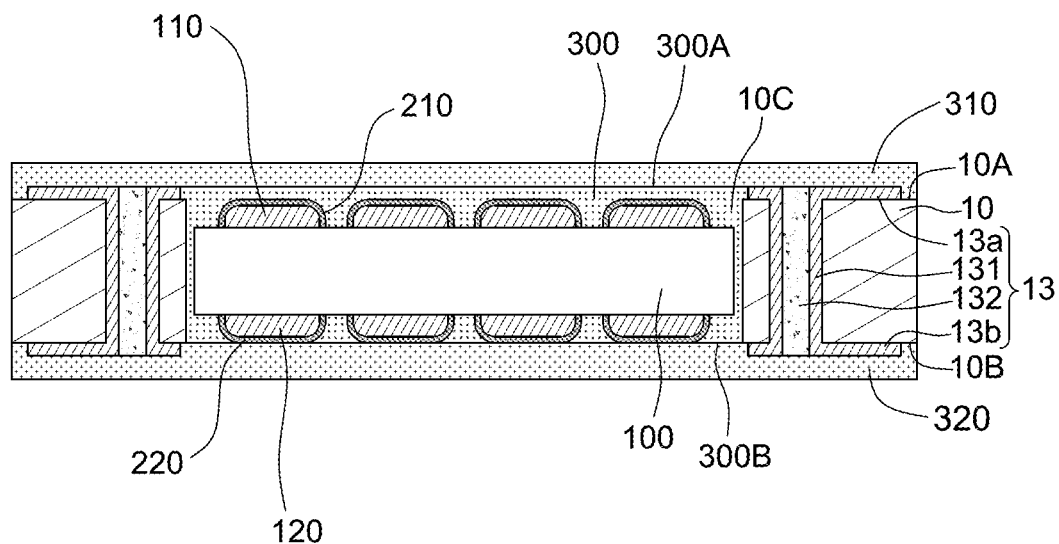

Referring to FIG. 7D, dielectric layers 310 and 320 may be formed on opposite surfaces 300A and 300B of the filling material 300. In some embodiments, the dielectric layer 310 is laminated onto the surface 300A of the filling material 300 and the upper surface 10A of the substrate 10. In some embodiments, the dielectric layer 320 is laminated onto the surface 300B of the filling material 300 and the bottom surface 10B of the substrate 10.

Figure 7E:
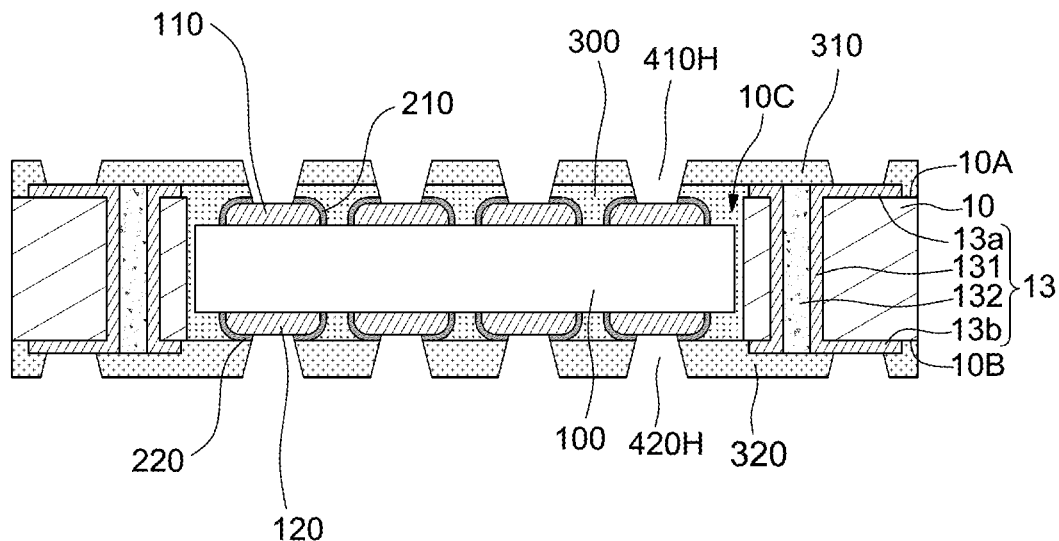

Referring to FIG. 7E, at least one through via 410H (also referred to as "at least one through hole" or "at least one opening") may be formed to penetrate through the dielectric layer 310, the filling material 300, and the protection layer 210. In some embodiments, at least one through via 420H (also referred to as "at least one through hole" or "at least one opening") is formed to penetrate through the dielectric layer 320 and the protection layer 220. The through vias 410H and 420H may be formed by laser drilling.

In some embodiments, the organometallic material of the protection layer 210 is more vulnerable to thermal decomposition than the materials of the dielectric layer 310 and the filling material 300 (e.g., the organometallic material of the protection layer 210 may deform, soften, or melt during thermal decomposition), and thus the portion of the through via 410H define by the protection layer 210 (e.g., the opening 210C illustrated in FIG. 2A) may have an irregular shape. In addition, in some embodiments, the organometallic material of the protection layer 210 may have a decomposition rate different from that of the materials of the dielectric layer 310 and the filling material 300 (e.g., decomposing more rapidly or slowly), and thus the through via 410H may have a stepped profile (e.g., the conductive vis 410 illustrated in FIG. 4A and FIG. 4B). In addition, in some embodiments, the material of the dielectric layer 310 may have a decomposition rate different from that of the material of the filling material 300 (e.g., decomposing more rapidly or slowly), and thus the through via 410H may have a stepped profile (e.g., the conductive vis 410 illustrated in FIG. 4C and FIG. 4D).

Figure 7F:
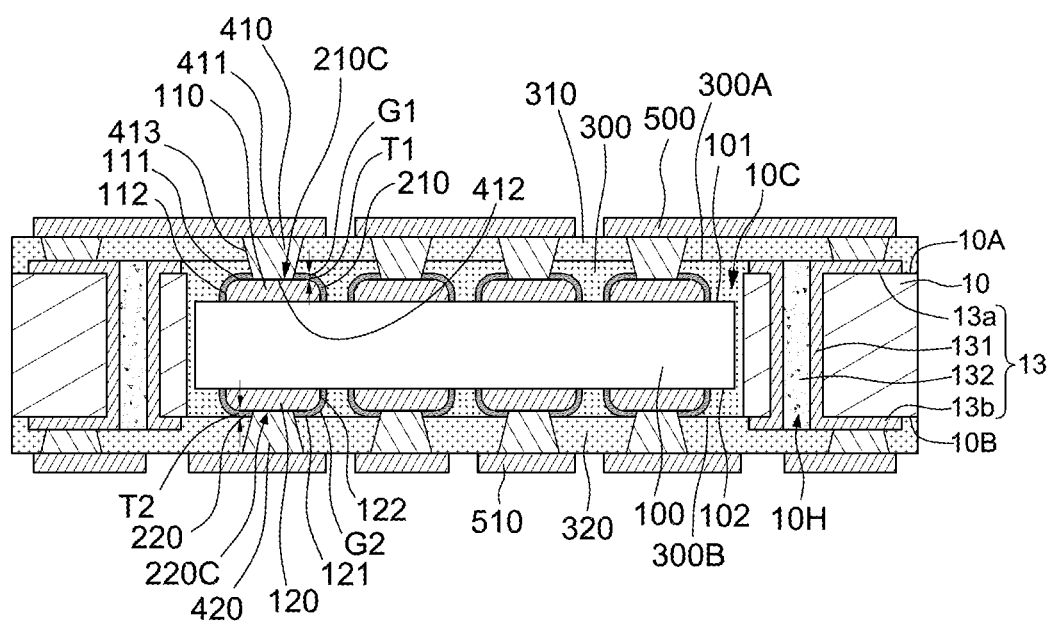

Referring to FIG. 7F, a conductive material may be formed in the through via 410H to form at least one conductive via 410, and a circuit layer 500 may be formed on the dielectric layer 310 and the conductive via 410. In some embodiments, a conductive material is formed in the through via 420H to form at least one conductive via 420, and a circuit layer 510 is formed on the dielectric layer 320 and the conductive via 420. The conductive material may be filled in the through vias 410H and 420H by electroplating. The conductive material outside the through vias 410H and 420H may be removed by etching, grinding, or the like. The circuit layers 500 and 510 each may be formed by various operations including deposition such as electroplating, patterning such as photolithography and/or etching, planarization such as grinding, and the like. As such, the semiconductor device package 3 as illustrated in FIG. 3 is formed.

Figure 7G:
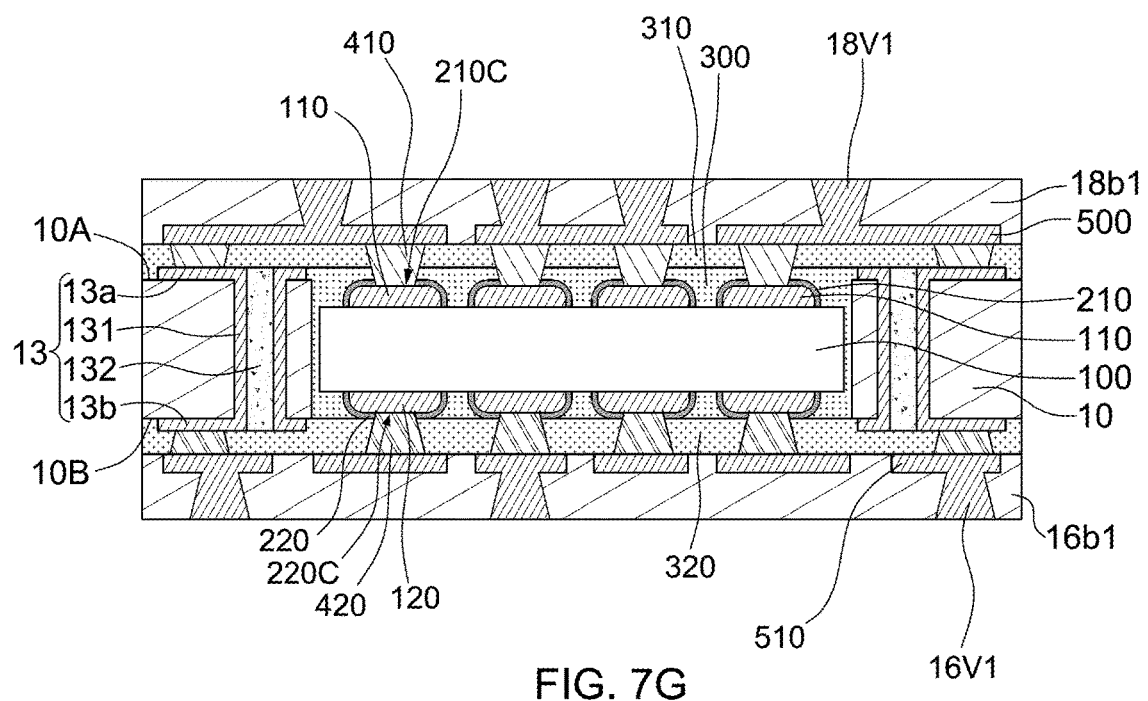

Referring to FIG. 7G, dielectric layers 18b1 and 16b1 may be formed on the circuit layers 500 and 510, respectively, through vias (or through holes, openings, or the like) may be formed to penetrate through the dielectric layers 18b1 and 16b1, and a conductive material may be formed in the through vias to form conductive vias 18V1 and 16V1 in the dielectric layers 18b1 and 16b1, respectively. In some embodiments, the dielectric layer 18b1 is laminated onto the circuit layer 500 and the dielectric layer 310. In some embodiments, the dielectric layer 16b1 is laminated onto the circuit layer 510 and the dielectric layer 320. The through vias may be formed by laser drilling. The conductive vias 18V1 and 16V1 each may be formed by various operations including deposition such as electroplating and planarization such as grinding, and the like.

Figure 7H:
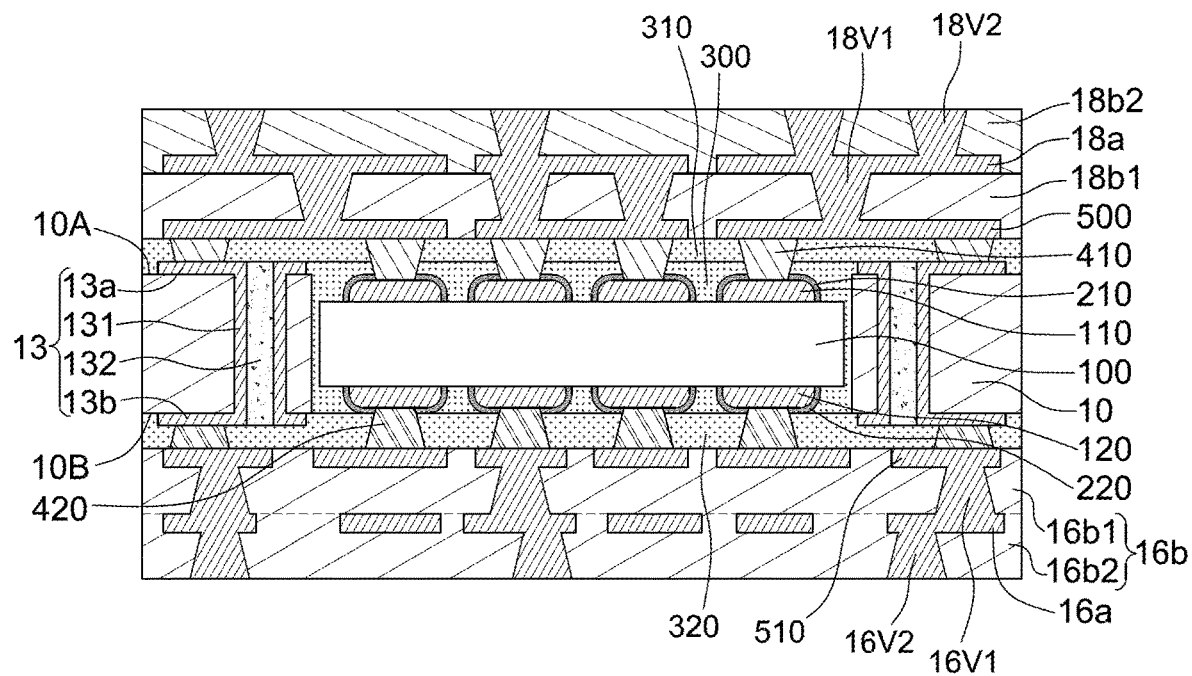

Referring to FIG. 7H, operations similar to those illustrated in FIGS. 7F-7G are performed to form wiring layers 18a and 16a, dielectric layers 18b2 and 16b2, and conductive vias 18V2 and 16V2.

Figure 7I:
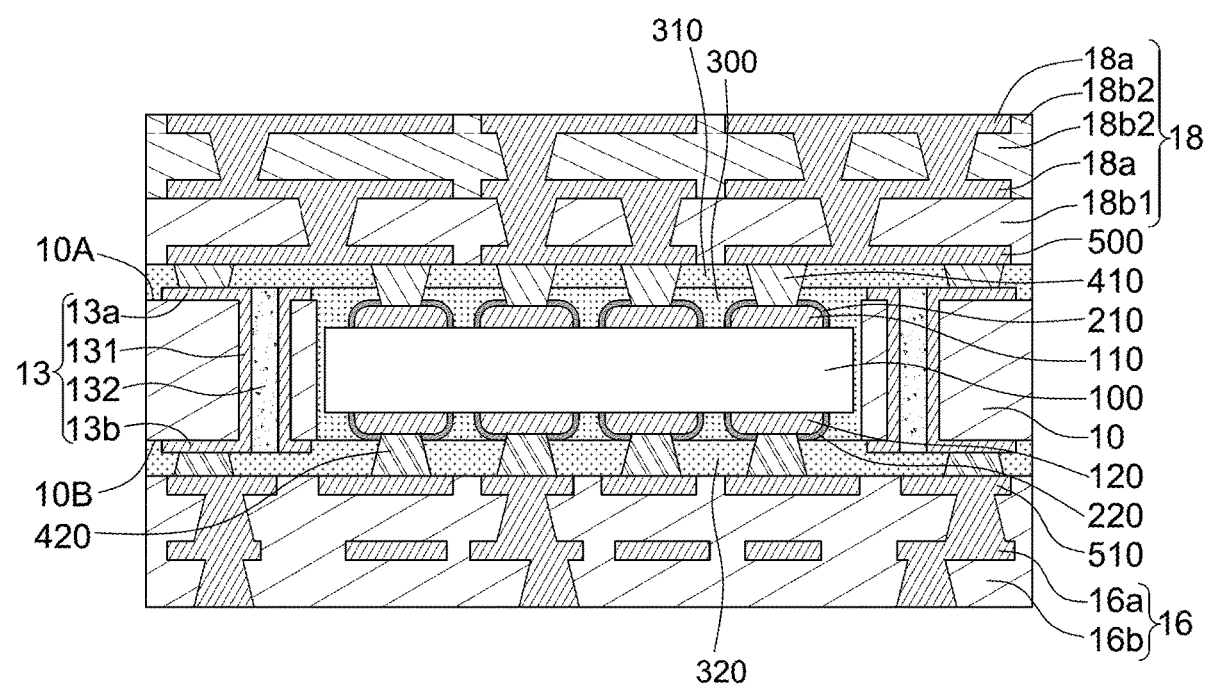

Referring to FIG. 7I, operations similar to those for forming the wiring layer 18a and the dielectric layer 18b2 illustrated in FIG. 7H are performed to form another dielectric layer 18b2 and another wiring layer 18a on the conductive via 18V2, and a planarization operation such as grinding or polishing may be performed on the wiring layer 18a and the dielectric layer 18b2, such that the uppermost wiring layer 18a and the uppermost dielectric layer 18b2 collectively form a uniform planar surface. As such, an upper RDL 18 is formed over the upper surface 10A of the substrate 10.

Figure 7J:
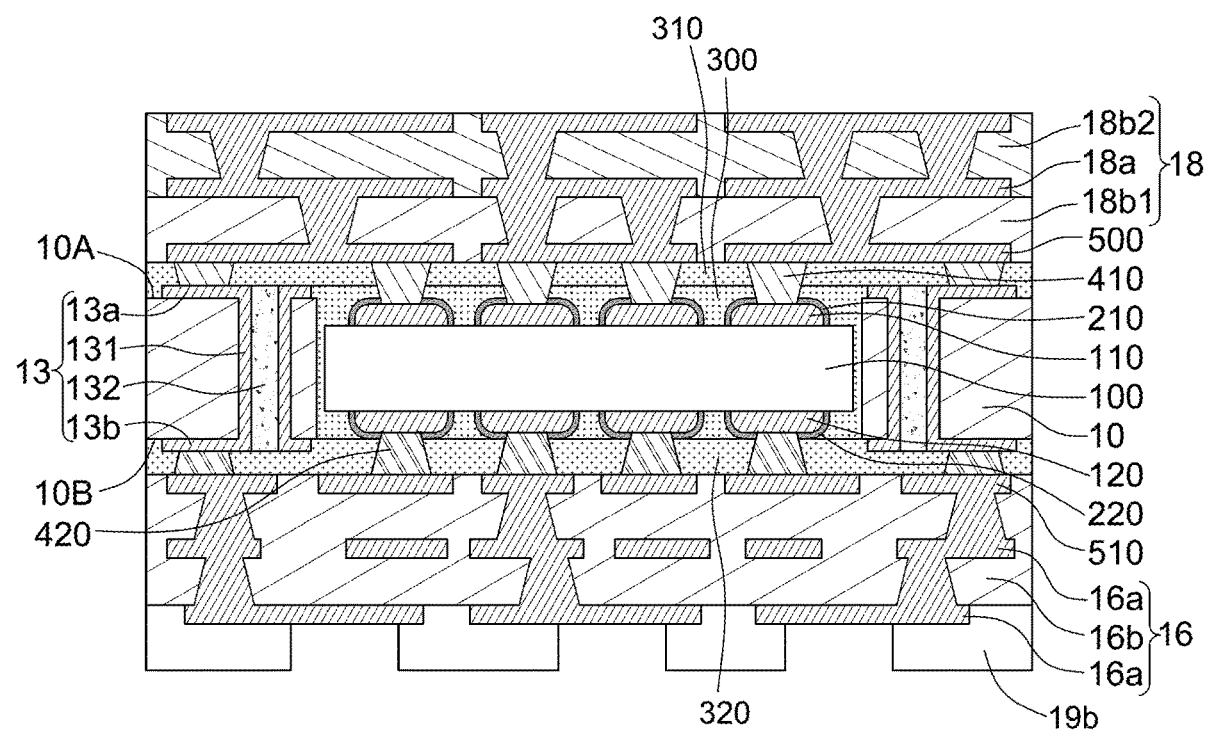

Referring to FIG. 7J, another wiring layer 16a may be formed on the conductive via 16V2, and an insulating layer 19b may be formed on the wiring layer 16a and the dielectric layer 16b exposing portions of the wiring layer 16a. The insulating layer 19b may include a solder mask layer.

Figure 7K:
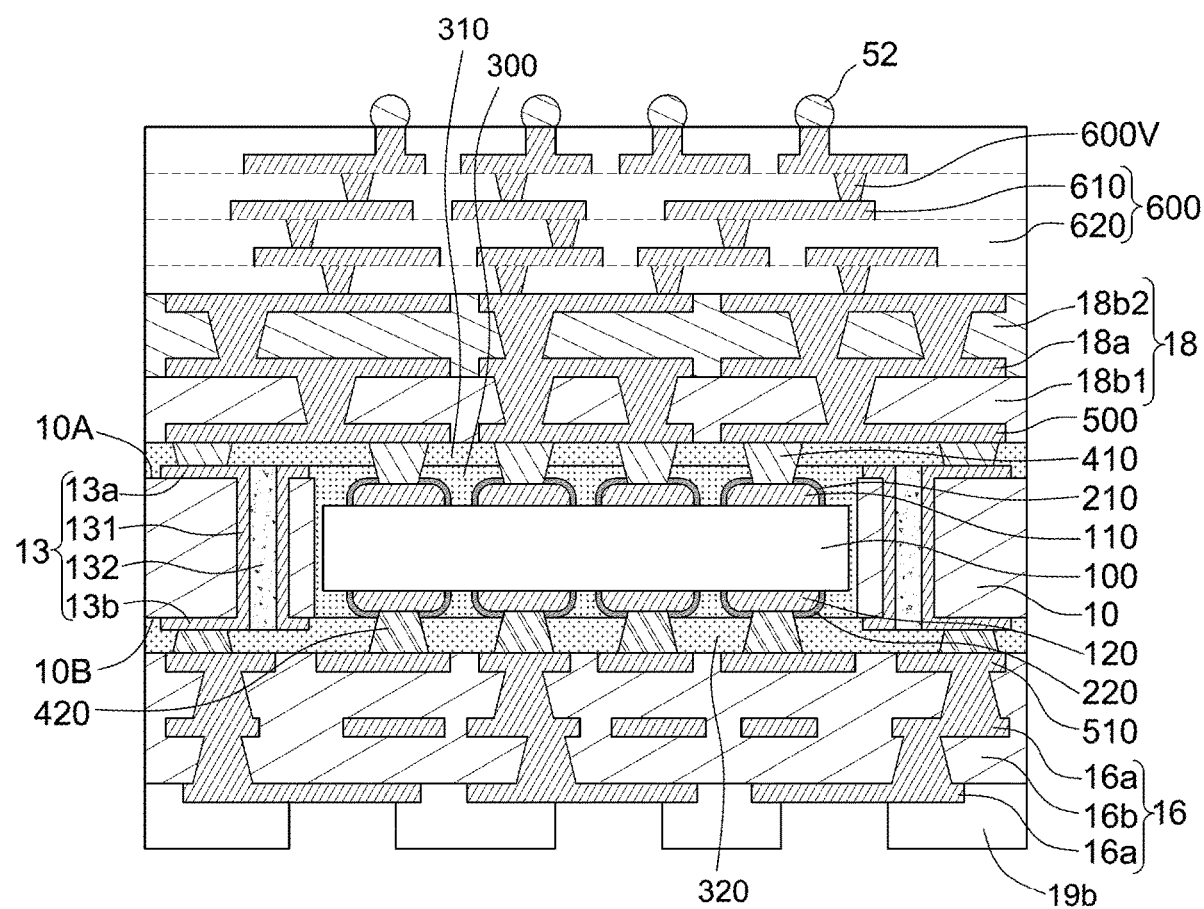

Referring to FIG. 7K, a circuit layer 600 may be formed on the upper RDL 18, and conductive bumps 52 such as solder bumps or the like may be formed on the circuit layer 600. In some embodiments, the circuit layer 600 may include at least one conductive wiring pattern 610 and at least one dielectric layer 620 stacked to each other. The conductive bumps 52 may be formed on the uppermost conductive wiring pattern 610. In some embodiments, the conductive wiring pattern 610 may include a plurality of conductive vias 600V. A bottommost conductive wiring pattern 610 may be exposed from a bottommost dielectric layer 620 and electrically connected to the upper RDL 18. The conductive wiring patterns 610 and the dielectric layers 620 may be formed by various operations including deposition, patterning such as photolithography and/or etching, planarization such as grinding and/or polishing, and the like.

Figure 7L:
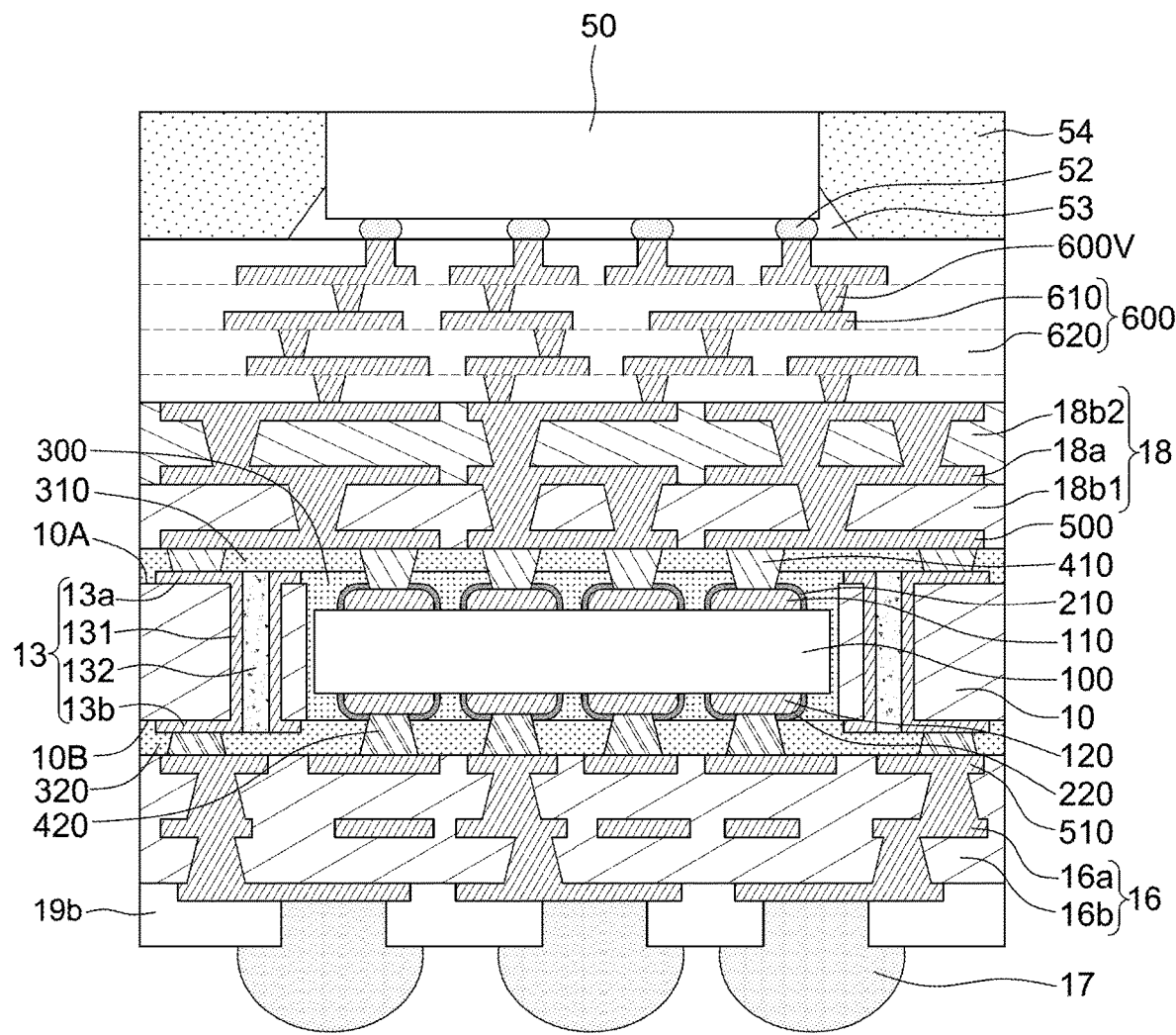

Referring to FIG. 7L, at least one electronic component 50 may be disposed on and electrically connected to the circuit layer 600. In some embodiments, the conductive bumps 52 are used to bond the electronic component 50 to the circuit layer 600. In some embodiments, an underfill layer 53 may be formed between the electronic component 50 and the circuit layer 600 and surrounding the conductive bumps 52. An encapsulation layer 54 may be formed on the circuit layer 600 to encapsulate the electronic component 50. In some embodiments, the encapsulation layer 54 may encapsulate sidewalls and an upper surface of the electronic component 50. The encapsulation layer 54 may be grinded to expose the upper surface of the electronic component 50. Electrical conductors 17 such as solder balls may be formed on the bottom RDL 16. As such, the semiconductor device package 6 as illustrated in FIG. 6 is formed. It is contemplated that the electronic component 50 is bonded to the circuit layer 600 after the circuit layer 600 is bonded to the substrate 10, which is a chip-last operation. Accordingly, the risk of damaging the electronic component 50 can be lowered.

FIG. 8A, FIG. 8B, FIG. 8C, FIG. 8D, FIG. 8E, FIG. 8F, and FIG. 8G illustrate various operations in a method of manufacturing a semiconductor device package 5 in accordance with some embodiments of the present disclosure.

Figure 8A:
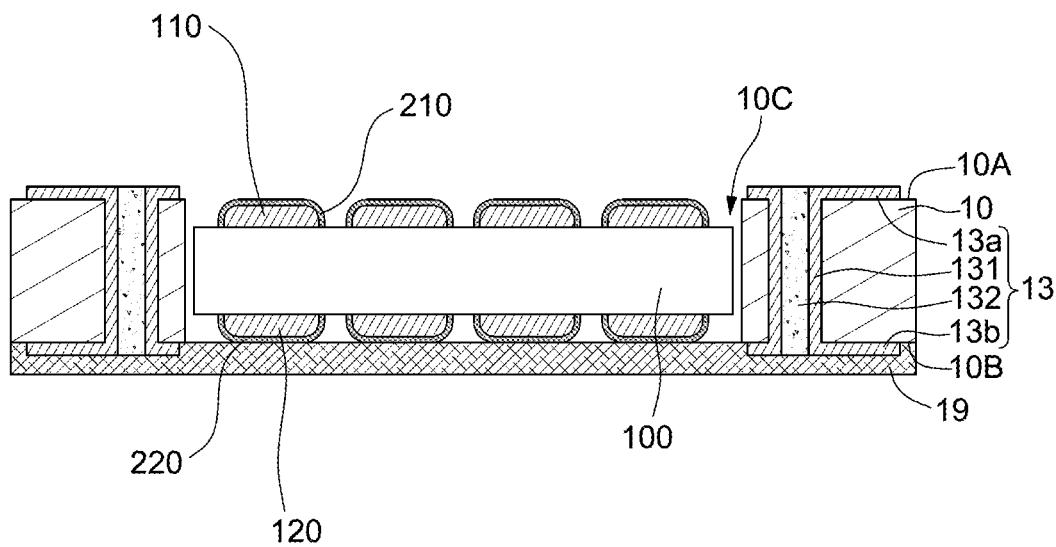
FIG. 8A, FIG. 8B, FIG. 8C, FIG. 8D, FIG. 8E, FIG. 8F, and FIG. 8G illustrate various operations in a method of manufacturing a semiconductor device package in accordance with some embodiments of the present disclosure.

Referring to FIG. 8A, a substrate 10 having a cavity 10C may be disposed on a carrier 19, at least one protection layer 210 may be formed on at least one conductive pad 110 of an electronic component 100, at least one protection layer 220 may be formed on at least one conductive pad 120 of the electronic component 100, and the electronic component 100 may be disposed in the cavity 10C of the substrate 10. In some embodiments, the electronic component 100 is disposed in the cavity 10C on the carrier 19.

The substrate 10 including at least one interconnection via 13 and having the cavity 10C may be formed by operations similar to those illustrated in FIG. 7A. In some embodiments, the substrate 10 is disposed on or bonded to the carrier 19. In some embodiments, the carrier 19 may be or include a tape. In some embodiments, a portion of the interconnection via 13 protruded out of the bottom surface 10B of the substrate 10 is extended into the carrier 19. The protection layers 210 and 220 may be formed by operations similar to those illustrated in FIG. 7A.

Figure 8B:
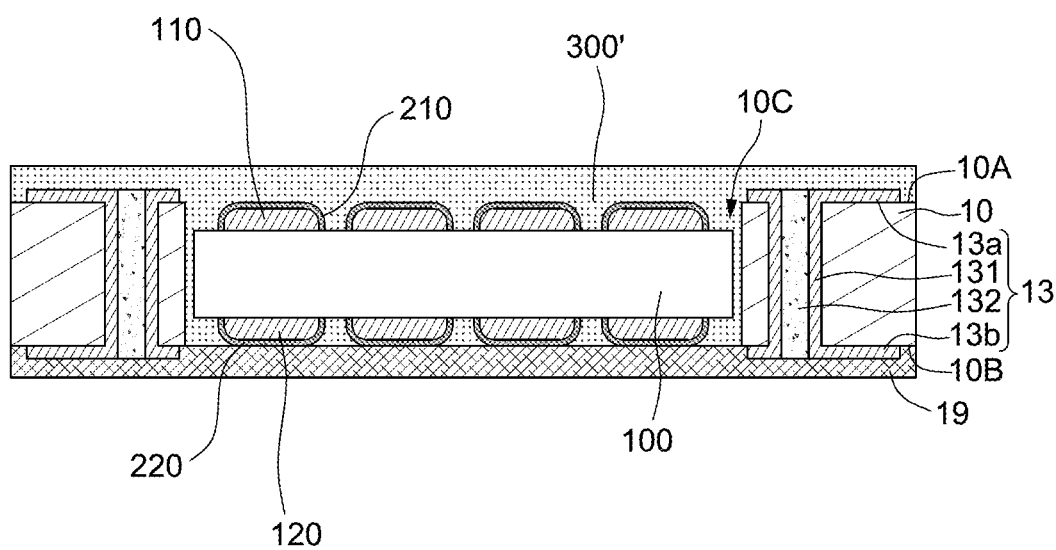

Referring to FIG. 8B, the protection layer 210 and the electronic component 100 may be encapsulated with a filling material 300' in the cavity 10C of the substrate 10. In some embodiments, the protection layer 220 facing the carrier 19 is in direct or physical contact with the carrier 19. In some embodiments, the protection layer 220 is encapsulated with the filling material 300' in the cavity 10C of the substrate 10. In some embodiments, the upper surface 10A of the substrate 10 and the upper conductive pad 13a of the interconnection via 13 are covered by the filling material 300'.

Figure 8C:
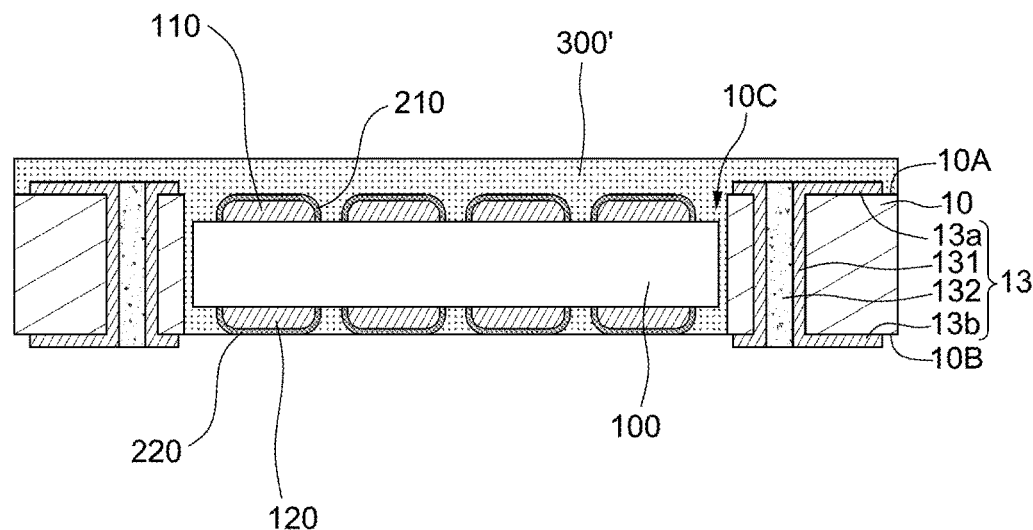

Referring to FIG. 8C, the carrier 19 may be removed from the substrate 10. In some embodiments, the carrier 19 is removed after the protection layers 210 and 220 and the electronic component 100 are encapsulated with the filling material 300'. In some embodiments, the protection layer 210 is fully covered and encapsulated by the filling material 300'. In some embodiments, an upper surface of the protection layer 220 and the bottom conductive pad 13b of the interconnection via 13 are exposed from the filling material 300' after the carrier 19 is removed.

Figure 8D:
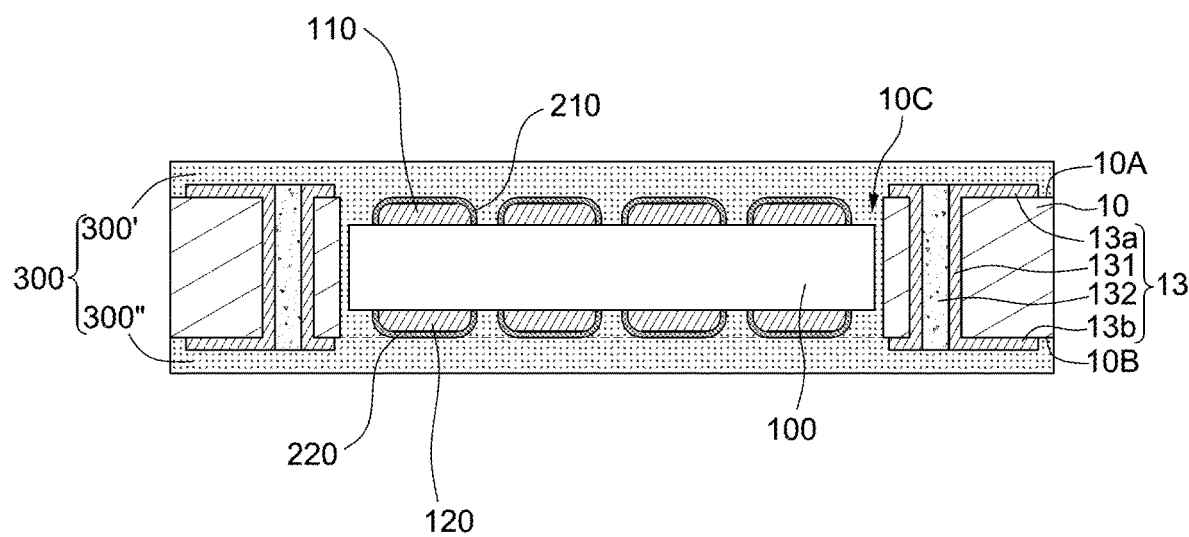

Referring to FIG. 8D, a dielectric layer 300" may be formed on the filling material 300', the bottom surface 10B of the substrate 10, and the bottom conductive pad 13b of the interconnection via 13. In some embodiments, the dielectric layer 300" is laminated onto the filling material 300', the bottom surface 10B of the substrate 10, and the bottom conductive pad 13b of the interconnection via 13. In some other embodiments, the dielectric layer 300" may be deposited on the filling material 300', the bottom surface 10B of the substrate 10, and the bottom conductive pad 13b of the interconnection via 13. The dielectric layer 300" and the filling material 300' collectively form a filling material 300 encapsulating the electronic component 100 and the upper surface 10A and the bottom surface 10B of the substrate 10.

Figure 8E:
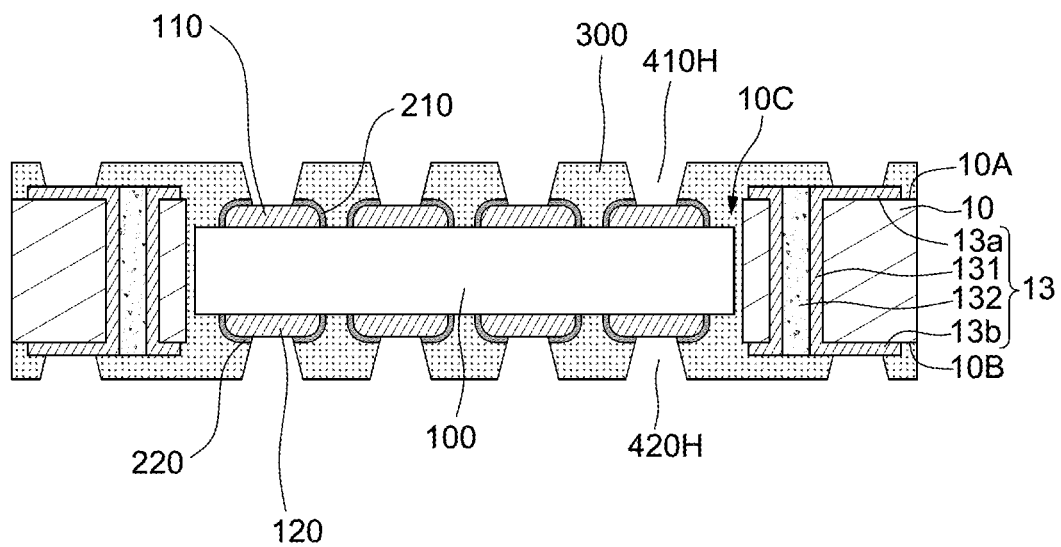

Referring to FIG. 8E, at least one through via 410H (also referred to as "at least one through hole" or "at least one opening") is formed to penetrate through the filling material 300 and the protection layer 210. In some embodiments, at least one through via 420H (also referred to as "at least one through hole" or "at least one opening") is formed to penetrate through the filling material 300 and the protection layer 220. The through vias 410H and 420H may be formed by laser drilling.

Figure 8F:
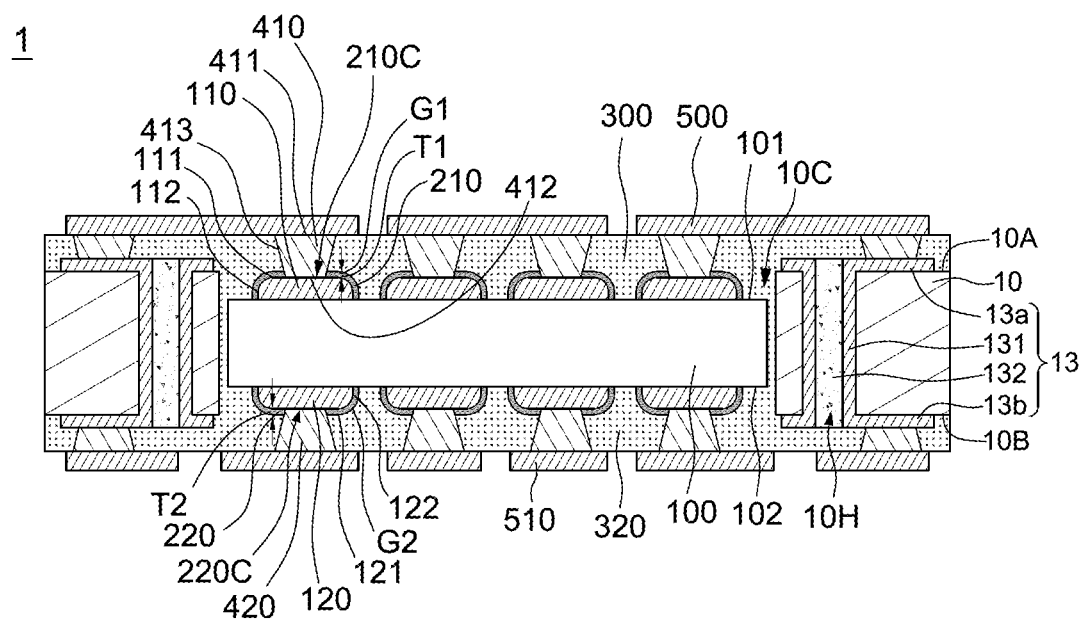

Referring to FIG. 8F, a conductive material is formed in the through via 410H to form at least one conductive via 410, and a circuit layer 500 is formed on the filling material 300 and the conductive via 410. In some embodiments, a conductive material is formed in the through via 420H to form at least one conductive via 420, and a circuit layer 510 is formed on the filling material 300 and the conductive via 420. The conductive material may be filled in the through vias 410H and 420H by electroplating. The conductive material outside the through vias 410H and 420H may be removed by etching, grinding, or the like. The circuit layers 500 and 510 each may be formed by various operations including deposition such as electroplating, patterning such as photolithography and/or etching, planarization such as grinding, and the like. As such, the semiconductor device package 1 as illustrated in FIG. 1 is formed.

Figure 8G:
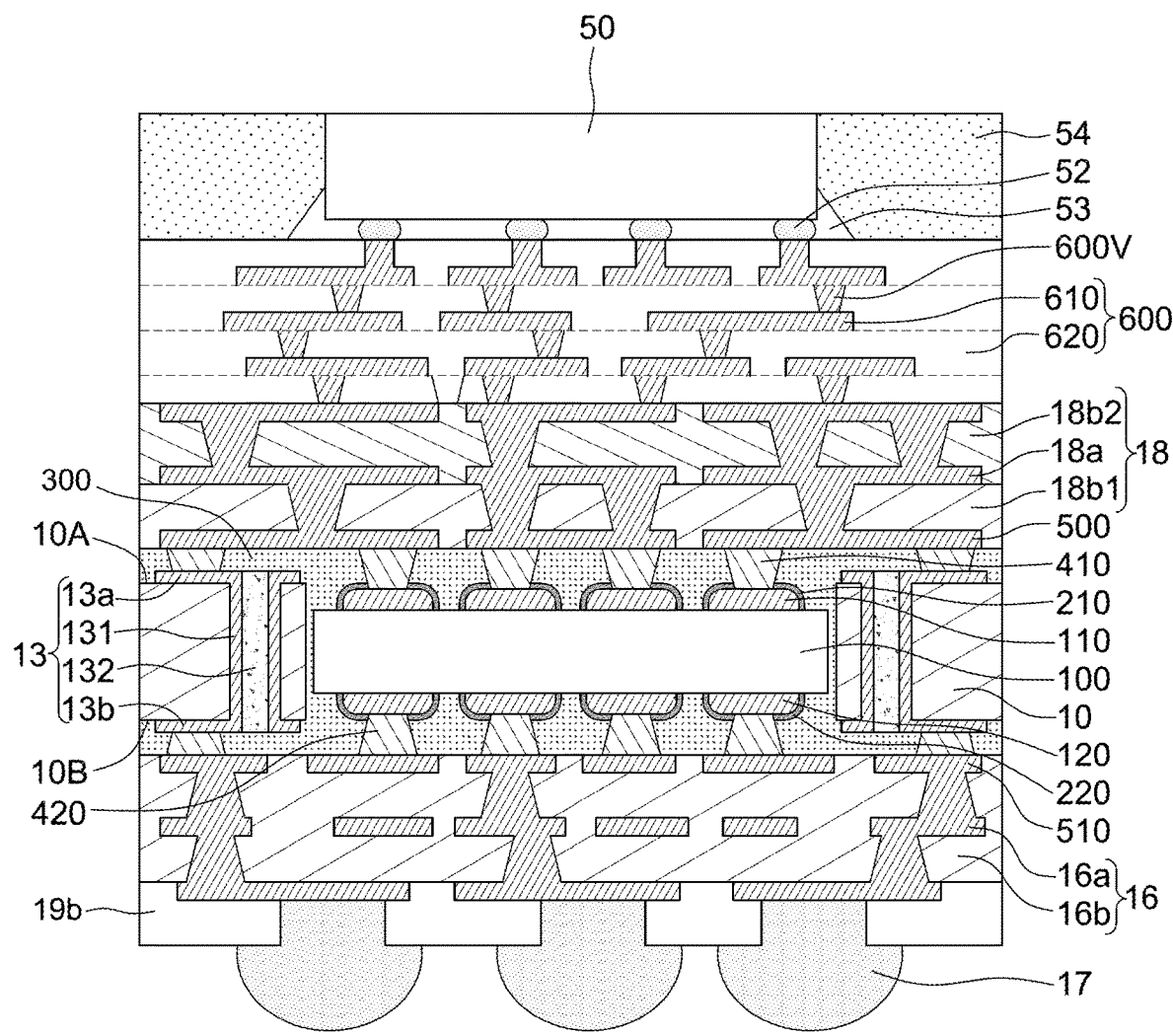

Referring to FIG. 8G, operations similar to those illustrated in FIGS. 7G-7L are performed to form an upper RDL 18 on the circuit layer 500, a bottom RDL 16 on the circuit layer 510, a circuit layer 600 on the circuit layer 610, an electronic component 50 bonded to the circuit layer 600, and electrical conductors 17 on the bottom RDL 16. As such, the semiconductor device package 5 as illustrated in FIG. 5 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device, comprising:
    an electronic component comprising a first conductive pad protruded out of a first surface of the electronic component; and
    a first protection layer covering an external surface of the first conductive pad, wherein the first surface of the electronic component is exposed from the first protection layer, and the first protection layer is conformal with the external surface of the first conductive pad of the electronic component.

2. The semiconductor device as claimed in claim 1, wherein the first protection layer comprises an organometallic complex.

3. The semiconductor device as claimed in claim 1, wherein the electronic component further comprises a second conductive pad protruded out of a second surface opposite to the first surface of the electronic component, and the semiconductor device package further comprises a second protection layer covering an external surface of the second conductive pad.

4. The semiconductor device as claimed in claim 1, wherein the electronic component comprises a passive component.

5. A semiconductor device package, comprising:
    a substrate defining a cavity;
    an electronic component disposed in the cavity, the electronic component comprising a conductive pad;
    a filling material in the cavity, wherein the filling material and the conductive pad are separated by an element; and
    a conductive via on an upper surface of the conductive pad, wherein a bottom portion of the conductive via contacts the element.

6. The semiconductor device package as claimed in claim 5, wherein a bottom surface of the conductive via is outflanked by the element.

7. The semiconductor device package as claimed in claim 5, wherein the bottom portion of the conductive via is recessed from or protruded out of a lateral surface of the conductive via.

8. The semiconductor device package as claimed in claim 5, wherein the bottom portion of the conductive via has a stepped structure.

9. The semiconductor device package as claimed in claim 5, wherein the element includes a protection layer.

10. The semiconductor device package as claimed in claim 9, wherein the protection layer defines an opening exposing a portion of the conductive pad.

11. The semiconductor device package as claimed in claim 10, wherein the opening of the protection layer is conformal with at least a portion of the bottom portion of the conductive via.

12. The semiconductor device package as claimed in claim 5, further comprising:
    a dielectric layer on the filling material;

wherein the conductive via penetrates through the dielectric layer and contacts the conductive pad.

13. The semiconductor device package as claimed in claim 12, wherein the dielectric layer and the conductive pad are separated by the element.

14. The semiconductor device package as claimed in claim 12, wherein the conductive via comprises a stepped structure, and a stepped surface of the stepped structure is substantially coplanar with an interface between the filling material and the dielectric layer.

15. The semiconductor device package as claimed in claim 14, wherein the stepped surface of the stepped structure contacts the dielectric layer or the filling material.

16. A semiconductor device package, comprising:
a substrate;
an electronic component embedded in the substrate, the electronic component comprising a conductive pad;
a protection layer embedded in the substrate and covering an external surface of the conductive pad;
a first circuit layer on the substrate and spaced apart from the protection layer, the first circuit layer being electrically connected to the electronic component; and
a conductive via penetrating through the protection layer and electrically connecting the first circuit layer to the conductive pad of the electronic component.

17. The semiconductor device package as claimed in claim 16, further comprising a second circuit layer electrically connected to the first circuit layer.

* * * * *